United States Patent
Kondakova et al.

(10) Patent No.: US 7,597,967 B2
(45) Date of Patent: Oct. 6, 2009

(54) PHOSPHORESCENT OLEDS WITH EXCITON BLOCKING LAYER

(75) Inventors: Marina E. Kondakova, Kendall, NY (US); Joseph C. Deaton, Rochester, NY (US); Christopher T. Brown, Rochester, NY (US); Kevin P. Klubek, West Henrietta, NY (US); Shouquan Huo, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 552 days.

(21) Appl. No.: 11/016,108

(22) Filed: Dec. 17, 2004

(65) Prior Publication Data

US 2006/0134460 A1    Jun. 22, 2006

(51) Int. Cl.
*H01L 51/54* (2006.01)

(52) U.S. Cl. .................. 428/690; 428/917; 313/504; 313/506

(58) Field of Classification Search .............. 428/690, 428/917; 313/504, 506
See application file for complete search history.

(56) References Cited

U.S. PATENT DOCUMENTS

| 5,766,779 | A * | 6/1998 | Shi et al. ............. 428/690 |
| 6,097,147 | A | 8/2000 | Baldo et al. |
| 6,392,250 | B1 | 5/2002 | Aziz et al. |
| 6,399,226 | B1 * | 6/2002 | Kitaguchi et al. ..... 428/690 |
| 6,573,651 | B2 * | 6/2003 | Adachi et al. ......... 313/504 |
| 6,893,743 | B2 * | 5/2005 | Sato et al. ............ 428/690 |
| 2002/0034656 | A1 * | 3/2002 | Thompson et al. ..... 428/690 |
| 2002/0074935 | A1 | 6/2002 | Kwong et al. |
| 2003/0104242 | A1 | 6/2003 | Aziz et al. |
| 2003/0134146 | A1 | 7/2003 | Aziz et al. |
| 2003/0141809 | A1 | 7/2003 | Furugori et al. |
| 2004/0048101 | A1 * | 3/2004 | Thompson et al. ..... 428/690 |
| 2004/0155238 | A1 | 8/2004 | Thompson et al. |
| 2005/0121666 | A1 * | 6/2005 | Kondakova et al. ..... 257/40 |

FOREIGN PATENT DOCUMENTS

| WO | 03/022008 | 3/2003 |
| WO | 03/059015 | 7/2003 |
| WO | 2004/062324 | 7/2004 |
| WO | 2005/062398 | 7/2005 |

OTHER PUBLICATIONS

Anthopoulos, T. D., et al., "Highly efficient single-layer dendrimer light-emitting diodes with balanced charge transport", Applied Physics Letters, vol. 82, No. 26, 2003, pp. 4824-4826.
Huo, S., et al., "Organometallic Materials and Electroluminescent Devices", U.S. Appl. No. 11/016,460 (D-88692) filed herewith (Dec. 17, 2004).

* cited by examiner

*Primary Examiner*—Dawn Garrett
(74) *Attorney, Agent, or Firm*—Arthur E. Kluegel; Raymond L. Owens

(57) ABSTRACT

An electroluminescent device comprises a cathode and an anode; and, located therebetween, a light-emitting layer (LEL) comprising at least one hole transporting co-host and at least one electron transporting co-host, together with at least one phosphorescent emitter, and wherein the triplet energy of each of the co-host materials is greater than the triplet energy of the phosphorescent emitter, and further containing an exciton blocking layer comprising a hole transporting material with triplet energy greater or equal to 2.5 eV adjacent the emitting layer on the anode side. The invention provides devices that emit light with high luminous efficiency at low voltage.

11 Claims, 1 Drawing Sheet

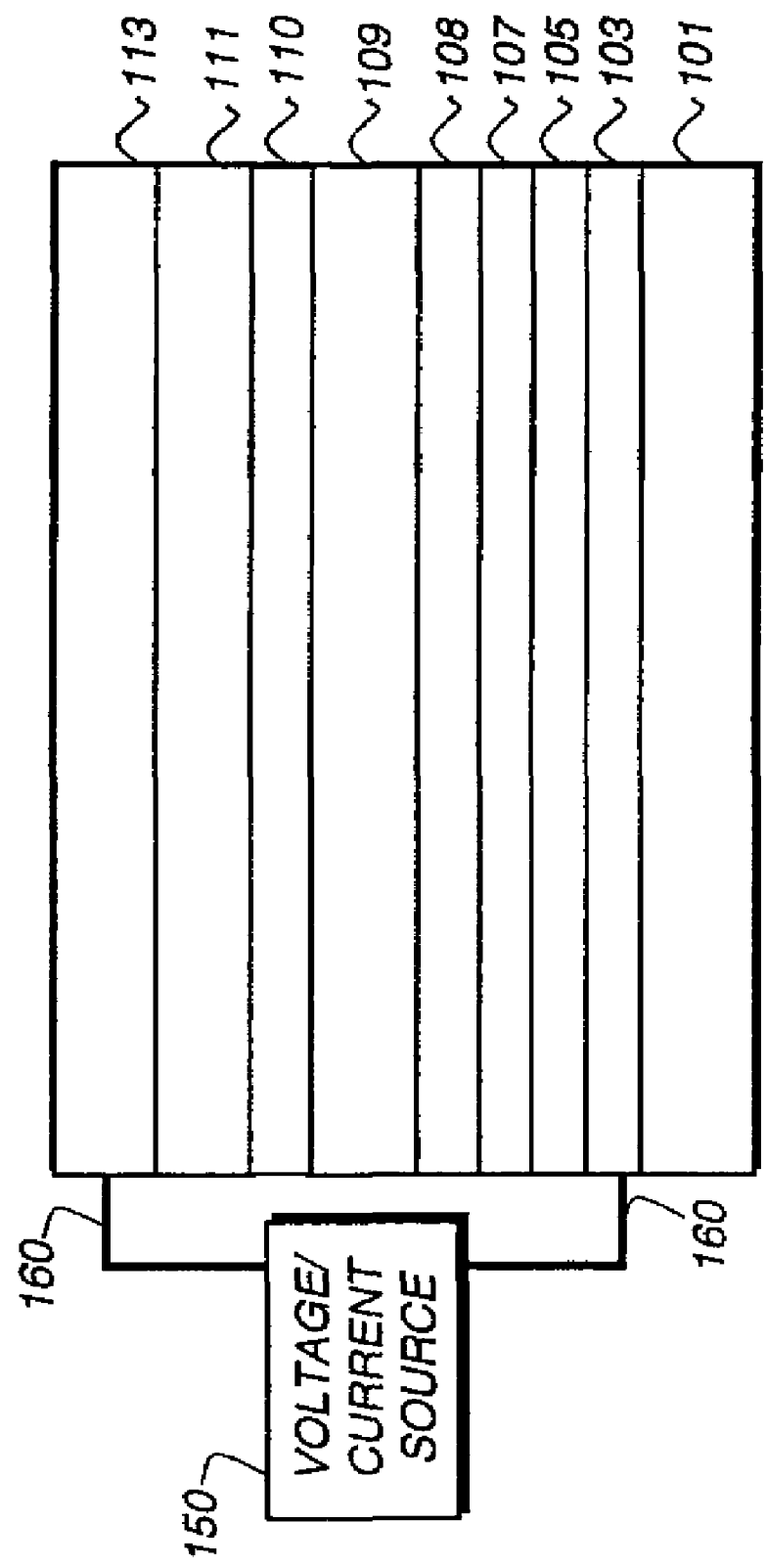

PHOSPHORESCENT OLEDS WITH EXCITON BLOCKING LAYER

CROSS REFERENCE TO RELATED APPLICATION

This application is being co-filed with an application entitled "Organometallic Materials And Electroluminescent Devices", U.S. Ser. No. 11/016,460, now abandoned, the contents of which are incorporated herein by reference.

FIELD OF THE INVENTION

This invention relates to an organic light emitting diode (OLED) electroluminescent (EL) device comprising an exciton blocking layer and a light emitting layer including hole- and electron transporting materials, together with a phosphorescent emitter, that can provide desirable electroluminescent properties such as high luminous and power efficiencies and low operational voltage.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, 30, 322, (1969); and Dresner U.S. Pat. No. 3,710,167, issued Jan. 9, 1973. The organic layers in these devices, usually composed of a polycyclic aromatic hydrocarbon, were very thick (much greater than 1 μm). Consequently, operating voltages were very high, often >100 V.

More recent organic EL devices include an organic EL element consisting of extremely thin layers (e.g. <1.0 μm) between the anode and the cathode. Herein, the term "organic EL element" encompasses the layers between the anode and cathode. Reducing the thickness lowered the resistance of the organic layers and has enabled devices that operate at much lower voltage. In a basic two-layer EL device structure, described first in U.S. Pat. No. 4,356,429, one organic layer of the EL element adjacent to the anode is specifically chosen to transport holes, and therefore is referred to as the hole transporting layer, and the other organic layer is specifically chosen to transport electrons and is referred to as the electron transporting layer. Recombination of the injected holes and electrons within the organic EL element results in efficient electroluminescence.

There have also been proposed three-layer organic EL devices that contain an organic light emitting layer (LEL) between the hole transporting layer and electron transporting layer, such as that disclosed by C. Tang et al. (J. Applied Physics, Vol. 65, 3610 (1989)). The light emitting layer commonly consists of a host material doped with a guest material, otherwise known as a dopant. Still further, there has been proposed in U.S. Pat. No. 4,769,292 a four-layer EL element comprising a hole injecting layer (HIL), a hole transporting layer (HTL), a light emitting layer (LEL) and an electron transporting/injecting layer (ETL). These structures have resulted in improved device efficiency.

Many emitting materials that have been described as useful in an OLED device emit light from their excited singlet state by fluorescence. The excited singlet state can be created when excitons formed in an OLED device transfer their energy to the singlet excited state of the dopant. However, only 25% of the excitons created in an EL device are singlet excitons. The remaining excitons are triplet, which cannot readily transfer their energy to the dopant to produce the singlet excited state of a dopant. This results in a large loss in efficiency since 75% of the excitons are not used in the light emission process.

Triplet excitons can transfer their energy to a dopant if it has a triplet excited state that is low enough in energy. If the triplet state of the dopant is emissive it can produce light by phosphorescence. In many cases, singlet excitons can also transfer their energy to the lowest singlet excited state of the same dopant. The singlet excited state can often relax, by an intersystem crossing process, to the emissive triplet excited state. Thus, it is possible, by the proper choice of host and dopant, to collect energy from both the singlet and triplet excitons created in an OLED device and to produce a very efficient phosphorescent emission. The term electrophosphorescence is sometimes used to denote electroluminescence wherein the mechanism of luminescence is phosphorescence.

Another process by which excited states of a dopant can be created is a sequential process in which a hole is trapped by the dopant and subsequently recombines with an electron, or an electron is trapped and subsequently recombines with a hole, in either case producing an excited state of the dopant directly. Singlet and triplet states, and fluorescence, phosphorescence, and intersystem crossing are discussed in J. G. Calvert and J. N. Pitts, Jr., Photochemistry (Wiley, N.Y., 1966) and further discussed in publications by S. R. Forrest and coworkers such as M. A. Baldo, D. F. O'Brien, M. E. Thompson, and S. R. Forrest, Phys. Rev. B, 60, 14422 (1999) and M. A. Baldo, S. R. Forrest, Phys. Rev. B, 62, 10956 (2000).

Emission from triplet states is generally very weak for most organic compounds because the transition from the triplet excited state to the singlet ground state is spin-forbidden. However, it is possible for compounds with states possessing a strong spin-orbit coupling interaction to emit strongly from triplet excited states to the singlet ground state (phosphorescence). For example, fac-tris(2-phenyl-pyridinato-N,$C^{2'}$-)Iridium(III) ($Ir(ppy)_3$) emits green light (K. A. King, P. J. Spellane, and R. J. Watts, J. Am. Chem. Soc., 107, 1431 (1985); M. G. Colombo, T. C. Brunold, T. Reidener, H. U. Güdel, M. Fortsch, and H.-B. Bürgi, Inorg. Chem., 33, 545 (1994)). Organic electroluminescent devices having high efficiency have been demonstrated with $Ir(ppy)_3$ as the phosphorescent material and 4,4'-N,N'-dicarbazole-biphenyl (CBP) as the host (M. A. Baldo, S. Lamansky, P. E. Burrows, M. E. Thompson, S. R. Forrest, Appl. Phys. Lett., 75, 4 (1999), T. Tsutsui, M.-J. Yang, M. Yahiro, K. Nakamura, T. Watanabe, T. Tsuji, Y. Fukuda, T. Wakimoto, S. Miyaguchi, Jpn. J. Appl. Phys., 38, L1502 (1999)). Additional disclosures of phosphorescent materials and organic electroluminescent devices employing these materials are found in U.S. Pat. No. 6,303,238 B1, WO 2000/57676, WO 2000/70655, WO 2001/41512 A1, WO 2002/02714 A2, WO 2003/040256 A2, and WO 2004/016711 A1.

Mixed hosts have been used to improve the efficiency, voltage and operational stability of phosphorescent OLED devices. H. Aziz et al. in U.S. Pat. No. 6,392,250 B1, US 2003/0104242 A1 and US 2003/0134146 A1 disclose organic electroluminescent devices having an emissive layer containing the phosphorescent 2,3,7,8,12,13,17,18-octaethyl-21H,23H-porhine Platinum(II) (PtOEP) dopant and an about equal weight percent of both NPB and Alq as host materials. R. Kwong et al. in US 2002/0074935 A1 also disclose devices with an emissive layer containing the PtOEP or bis(benzothienyl-pyridinato-N ^C)Iridium(III)(acetylacetonate) as a dopant and equal proportions of NPB and Alq as host materials. In US 2004/0155238 a light emitting layer of the OLED device contains a wide band gap inert host matrix in combination with a charge carrying material and a phosphorescent emitter. The charge carrying compound can transport holes or electrons, and it is selected so that charge carrying material and phosphorescent emitter transport charges of opposite polarity. However, in this case, blue OLED devices employing these disclosed materials require use of substantial amounts of the phosphorescent emitters and still do not solve the high voltage problem.

M. Furugori et al. in US 2003/0141809 disclose phosphorescent devices where a host material is mixed with another hole- or electron transporting material in the light emitting layer. The document describes that devices utilizing plural host compounds show higher current and higher efficiencies at a given voltage; however, reported luminance data are quite moderate. Efficient single-layer-solution processed phosphorescent OLED devices based on fac-tris(2-phenylpyridine) Iridium cored dendrimer are described in T. Anthopoulos et al., *Appl. Phys. Lett.*, 82, 4824 (2003). T. Igarashi et al. in WO 2004/062324 A1 disclose phosphorescent devices with the light emitting layer containing at least one electron transporting compound, at least one hole transporting compound and a phosphorescent dopant. Various materials were tested as co-hosts for the blue and green emitters, and high efficiency devices are reported. However, luminous and power efficiencies of the disclosed OLEDs can be improved much further.

High emission efficiency in phosphorescent OLED devices with a neat host is usually obtained by incorporating a hole blocking material between the light emitting layer and the cathode in order to limit the migration of holes and confine electron-hole recombination and the resulting excitons to the light emitting layer (for example, see U.S. Pat. No. 6,097, 147).

In addition to a hole blocking layer, a phosphorescent OLED device employing a neat host and a phosphorescent material may include at least one hole transporting layer with suitable triplet energy levels, placed adjacent the light emitting layer on the anode side, to help confine the electron-hole recombination events to the light emitting layer. This feature can further improve the efficiency of the device. Examples of hole transporting materials whose energy levels make them suitable for use with many phosphorescent materials include 4,4',4"-tris(N-3 -methylphenyl-N-phenylamino)triphenylamine(MTDATA; see JP2003092186A), bis[4-(N,N-diethylamino)-2-methylphenyl](4-methylphenyl)methane (MPMP; see WO02/02714 and WO03/040257), N,N-bis[2, 5-dimethyl-4-[(3-methylphenyl)phenylamino]phenyl]-2,5-dimethyl-N'-(3-methylphenyl)-N'-phenyl-1,4-benzenediamine (see JP2004 139819 A and US 2004/018910 A1). However, use of these materials alone does not give the optimum performance possible in an electroluminescent device.

M. Thompson et al. in US 2004/0048101 disclose phosphorescent blue and white OLED devices comprising an electron blocking layer and the light emitting layer with a neat host and a phosphorescent emitter. By inserting an electron blocking layer between the hole transporting and light emitting layers electron leakage can be eliminated and, hence, luminous efficiency is increased. Fac-tris(1-phenylpyrazolato, $N,C^{2'}$)Iridium (III) (Irppz) and Iridium(III)bis(1-phenylpyrazolato, $N,C^{2'}$)(2,2,6,6-tetramethyl-3,5-heptanedionato-O,O) ($ppz_2Ir(dpm)$) have been disclosed as suitable electron blocking materials.

Notwithstanding all these developments, there remains a need to further improve efficiency and reduce drive voltage of the devices, as well as to improve other features such as operational stability.

SUMMARY OF THE INVENTION

The invention provides an OLED device comprising a cathode, an anode, and located therebetween a light emitting layer (LEL) comprising at least one hole transporting co-host and at least one electron transporting co-host, together with a phosphorescent emitter, and wherein the triplet energy of each of the co-host materials is greater than the triplet energy of the phosphorescent emitter, and further containing an exciton blocking layer comprising a hole transporting material with triplet energy greater or equal to 2.5 eV adjacent the emitting layer on the anode side.

The devices of the invention exhibit improved efficiency and reduced drive voltage.

BRIEF DESCRIPTION OF THE DRAWINGS

FIG. 1 shows a cross-section of a schematic of a typical OLED device in which this invention may be used.

DETAILED DESCRIPTION OF THE INVENTION

The electroluminescent device is summarized above. The device can also include a hole injecting layer, a hole transporting layer, a hole blocking layer, an electron transporting layer, or more than one of these optional layers.

According to the present invention, the light emitting layer of the EL device comprises at least one co-host consisting of hole transporting material(s), and at least one co-host consisting of electron transporting material(s), and one or more phosphorescent emitters. An efficiency-enhancing exciton blocking layer is placed adjacent the light emitting layer on the anode side.

Suitable co-host materials should be selected so that transfer of a triplet exciton can occur efficiently from the host material to the phosphorescent emitter but cannot occur efficiently from the phosphorescent emitter to the host material. Therefore, it is highly desirable that the triplet energy of the phosphorescent emitter be lower than the triplet energies of each of the co-host materials. Generally speaking, a large triplet energy implies a large optical band gap. However, the band gap of the co-host materials should not be chosen so large as to cause an unacceptable barrier to injection of charge carriers into the light emitting layer and an unacceptable increase in the drive voltage of the OLED device.

The light emitting layer contains more than one host material in order to improve the device's film morphology, electrical properties, light emission efficiency, and lifetime. It is highly desirable that the light emitting layer contains a first co-host material that has good hole transporting properties, and a second co-host material that has good electron transporting properties.

The desirable hole transporting co-host may be any suitable hole transporting compound, such as a triarylamine or a carbazole, as long it has a triplet energy higher than that of the phosphorescent emitter to be employed.

A suitable class of hole transporting compounds for use as a co-host of the present invention are aromatic tertiary amines, by which it is understood to be compounds containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No.

3,180,730. Other suitable triarylamines substituted with one or more vinyl radicals and/or comprising at least one active hydrogen containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural formula (1):

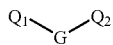
(1)

wherein $Q_1$ and $Q_2$ are independently selected aromatic tertiary amine moieties, and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (1) and containing two triarylamine moieties is represented by structural formula (2):

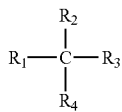
(2)

wherein
$R_1$ and $R_2$ each independently represents a hydrogen atom, an aryl group, or an alkyl group; or $R_1$ and $R_2$ together represent the atoms completing a cycloalkyl group; and
$R_3$ and $R_4$ each independently represents an aryl group, which is in turn substituted with a diaryl substituted amino group, as indicated by structural formula (3):

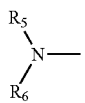
(3)

wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines is the tetraaryldiamines. Desirable tetraaryldiamines include two diarylamino groups, such as indicated by formula (3), linked through an arylene group. Useful tetraaryldiamines include those represented by formula (4):

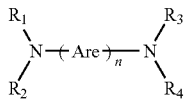
(4)

wherein each Are is an independently selected arylene group, such as a phenylene or anthracene moiety,
n is selected from 1 to 4, and
$R_1$-$R_4$ are independently selected aryl groups.
In a typical embodiment, at least one of $R_1$-$R_4$ is a polycyclic fused ring structure, e.g., a naphthalene.

The various alkyl, alkylene, aryl, and arylene moieties of the foregoing structural formulas (1), (2), (3), and (4) can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms, such as cyclopentyl, cyclohexyl, and cycloheptyl ring structures. The aryl and arylene moieties are usually phenyl and phenylene moieties.

Representative examples of the useful compounds include the following:
4,4'-Bis[N-(1-naphthyl)-N-phenylamino]biphenyl (NPB);
4,4'-Bis[N-(1-naphthyl)-N-(2-naphthyl)amino]biphenyl (TNB);
4,4'-Bis[N-(3-methylphenyl)-N-phenylamino]biphenyl (TPD);
4,4'-Bis-diphenylamino-terphenyl;
2,6,2',6'-tetramethyl-N,N,N',N'-tetraphenyl-benzidine.

In one suitable embodiment the hole transporting co-host comprises a material of formula (5):

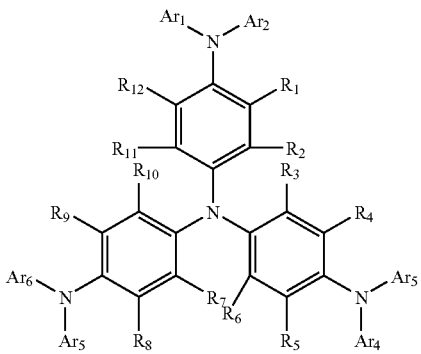
(5)

In formula (5), $Ar_1$-$Ar_6$ independently represent aromatic groups, for example, phenyl groups or tolyl groups;
$R_1$-$R_{12}$ independently represent hydrogen or independently selected substituent, for example an alkyl group containing from 1 to 4 carbon atoms, an aryl group, a substituted aryl group.

Examples of the suitable materials include, but are not limited to:
4,4',4''-tris[(3-methylphenyl)phenylamino]triphenylamine (MTDATA);
4,4',4''-tris(N,N-diphenyl-amino)triphenylamine (TDATA);
N,N-bis[2,5-dimethyl-4-[(3-methylphenyl)phenylamino] phenyl]-2,5-dimethyl-N'-(3-methylphenyl)-N'-phenyl-1, 4-benzenediamine.

In one desirable embodiment the hole transporting co-host comprises a material of formula (6):

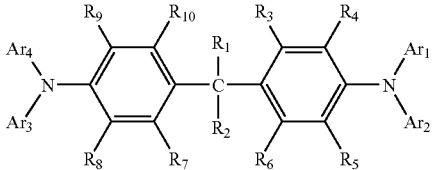
(6)

In formula (6), $R_1$ and $R_2$ represent substituents, provided that $R_1$ and $R_2$ can join to form a ring. For example, $R_1$ and $R_2$ can be methyl groups or join to form a cyclohexyl ring;
$Ar_1$-$Ar_4$ represent independently selected aromatic groups, for example phenyl groups or tolyl groups;
$R_3$-$R_{10}$ independently represent hydrogen, alkyl, substituted alkyl, aryl, substituted aryl group.

Examples of suitable materials include, but are not limited to:
1,1-Bis(4-(N,N-di-p-tolylamino)phenyl)cyclohexane (TAPC);
1,1-Bis(4-(N,N-di-p-tolylamino)phenyl)cyclopentane;
4,4'-(9H-fluoren-9-ylidene)bis[N,N-bis(4-methylphenyl)-benzenamine;

1,1-Bis(4-(N,N-di-p-tolylamino)phenyl)-4-phenylcyclohexane;
1,1-Bis(4-(N,N-di-p-tolylamino)phenyl)-4-methylcyclohexane;
1,1-Bis(4-(N,N-di-p-tolylamino)phenyl)-3-phenylpropane;
Bis[4-(N,N-diethylamino)-2-methylphenyl](4-methylpenyl)methane;
Bis[4-(N,N-diethylamino)-2-methylphenyl](4-methylphenyl)ethane;
4-(4-Diethylaminophenyl)triphenylmethane;
4,4'-Bis(4-diethylaminophenyl)diphenylmethane.

A useful class of triarylamines suitable for use as the hole transporting co-host includes carbazole derivatives such as those represented by formula (7):

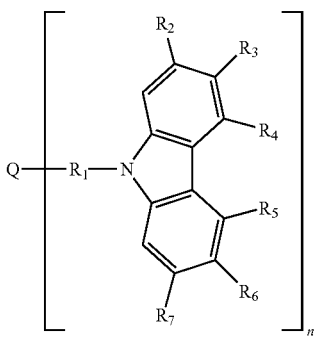

(7)

In formula (7), Q independently represents nitrogen, carbon, an aryl group, or substituted aryl group, preferably a phenyl group;

$R_1$ is preferably an aryl or substituted aryl group, and more preferably a phenyl group, substituted phenyl, biphenyl, substituted biphenyl group;

$R_2$ through $R_7$ are independently hydrogen, alkyl, phenyl or substituted phenyl group, aryl amine, carbazole, or substituted carbazole;

and n is selected from 1 to 4.

Another useful class of carbazoles satisfying structural formula (7) is represented by formula (8):

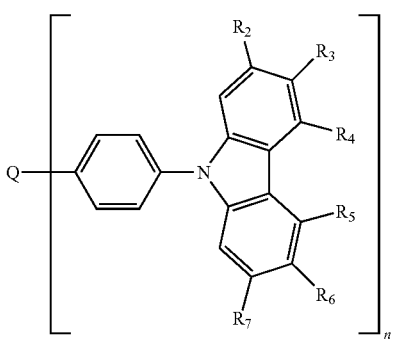

(8)

wherein n is an integer from 1 to 4;
Q is nitrogen, carbon, an aryl, or substituted aryl;
$R_2$ through $R_7$ are independently hydrogen, an alkyl group, phenyl or substituted phenyl, an aryl amine, a carbazole and substituted carbazole.

Illustrative of useful substituted carbazoles are the following:
4-(9H-carbazol-9-yl)-N,N-bis[4-(9H-carbazol-9-yl)phenyl]-benzenamine (TCTA);
4-(3-phenyl-9H-carbazol-9-yl)-N,N-bis[4(3-phenyl-9H-carbazol-9-yl)phenyl]-benzenamine;
9,9'-[5'-[4-(9H-carbazol-9-yl)phenyl][1,1':3',1''-terphenyl]-4,4''-diyl]bis-9H-carbazole.

In one suitable embodiment the hole transporting co-host comprises a material of formula (9):

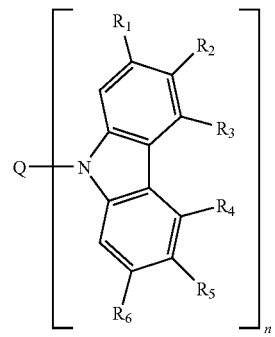

(9)

In formula 9, n is selected from 1 to 4;
Q independently represents phenyl group, substituted phenyl group, biphenyl, substituted biphenyl group, aryl, or substituted aryl group;
$R_1$ through $R_6$ are independently hydrogen, alkyl, phenyl or substituted phenyl, aryl amine, carbazole, or substituted carbazole.

Examples of suitable materials are the following:
9,9'-(2,2'-dimethyl[1,1'-biphenyl]-4,4'-diyl)bis-9H-carbazole (CDBP);
9,9'-[1,1'-biphenyl]-4,4'-diyl)bis-9H-carbazole (CBP);
9,9'-(1,3-phenylene)bis-9H-carbazole (mCP);
9,9'-(1,4-phenylene)bis-9H-carbazole;
9,9',9''-(1,3,5-benzenetriyl)tris-9H-carbazole;
9,9'-(1,4-phenylene)bis[N,N,N',N'-tetraphenyl-9H-carbazole-3,6-diamine;
9-[4-(9H-carbazol-9-yl)phenyl]-N,N-diphenyl-9H-carbazol-3-amine;
9,9'-(1,4-phenylene)bis[N,N-diphenyl-9H-carbazol-3-amine;
9-[4-(9H-carbazol-9-yl)phenyl]-N,N,N',N'-tetraphenyl-9H-carbazole-3,6-diamine.

The optimum concentration of the hole transporting co-host in the present invention may be determined by experimentation and may be within the range 10 to 60 weight % of the total of the hole- and electron transporting co-host materials in the light emitting layer, and is often found to be in the range 15 to 30 wt. %.

The desirable electron transporting co-host may be any suitable electron transporting compound, such as benzazole, phenanthroline, 1,3,4-oxadiazole, triazole, triazine, or triarylborane, as long as it has a triplet energy that is higher than that of the phosphorescent emitter to be employed.

A preferred class of benzazoles is described by Jianmin Shi et al. in U.S. Pat. Nos. 5,645,948 and 5,766,779. Such compounds are represented by structural formula (10):

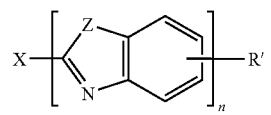

(10)

In formula (10), n is selected from 2 to 8;
Z is independently O, NR or S;
R and R' are individually hydrogen; alkyl of from 1 to 24 carbon atoms, for example, propyl, t-butyl, heptyl, and the like; aryl or hetero-atom substituted aryl of from 5 to 20 carbon atoms, for example, phenyl and naphthyl, furyl, thienyl, pyridyl, quinolinyl and other heterocyclic systems; or halo such as chloro, fluoro; or atoms necessary to complete a fused aromatic ring; and X is a linkage unit consisting of carbon, alkyl, aryl, substituted alkyl, or substituted aryl, which conjugately or unconjugately connects the multiple benzazoles together.

An example of a useful benzazole is 2,2′,2″-(1,3,5-phenylene)tris[1-phenyl-1H-benzimidazole] (TPBI) represented by a formula (11) shown below:

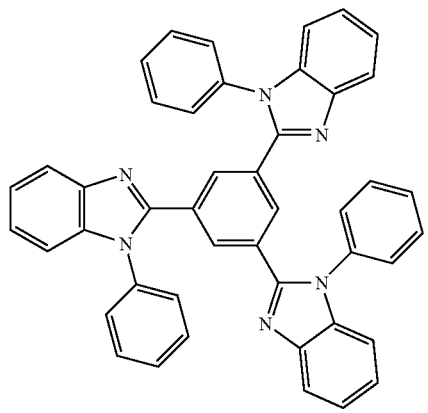

(11)

Another class of the electron transporting materials suitable for use as a co-host includes various substituted phenanthrolines as represented by formula (12):

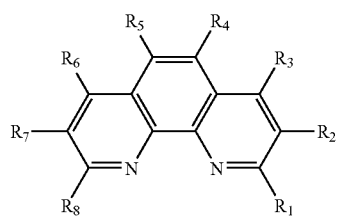

(12)

In formula (12), $R_1$-$R_8$ are independently hydrogen, alkyl group, aryl or substituted aryl group, and at least one of $R_1$-$R_8$ is aryl group or substituted aryl group.

Examples of suitable materials are 2,9-dimethyl-4,7-diphenyl-phenanthroline (BCP) (see formula (13)) and 4,7-diphenyl-1,10-phenanthroline (Bphen) (see formula (14)).

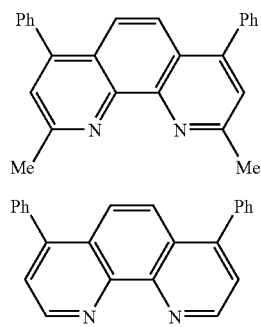

(13)

(14)

The triarylboranes that function as the electron transporting co-host in the present invention may be selected from compounds having the chemical formula (15):

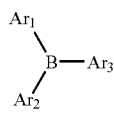

(15)

wherein $Ar_1$ to $Ar_3$ are independently an aromatic hydrocarbocyclic group or an aromatic heterocyclic group which may have a substituent. It is preferable that compounds having the above structure are selected from formula (16):

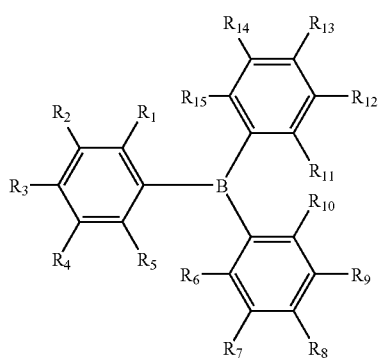

(16)

wherein $R_1$-$R_{15}$ are independently hydrogen, fluoro, cyano, trifluoromethyl, sulfonyl, alkyl, aryl or substituted aryl group.

Specific representative embodiments of the triarylboranes include:

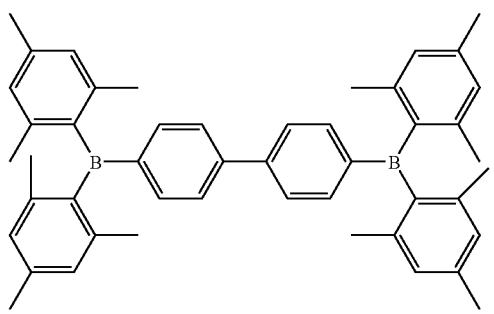

(17)

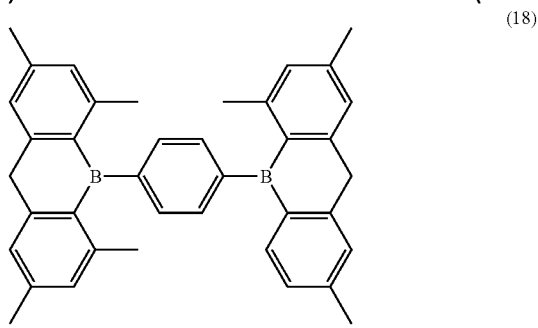

(18)

-continued (19)

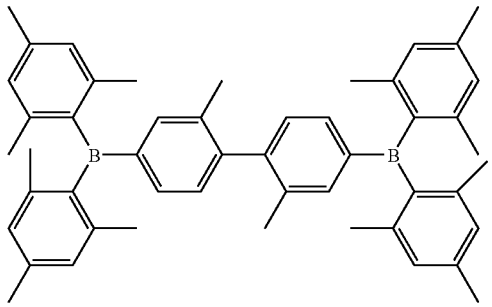

The electron transporting co-host in the present invention may be selected from substituted 1,3,4-oxadiazoles. Illustrative of the useful substituted oxadiazoles are the following:

(20)

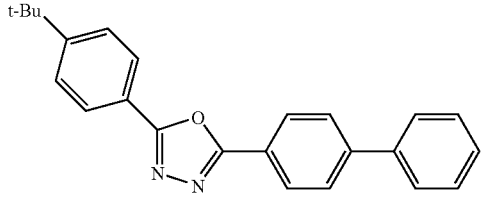

(21)

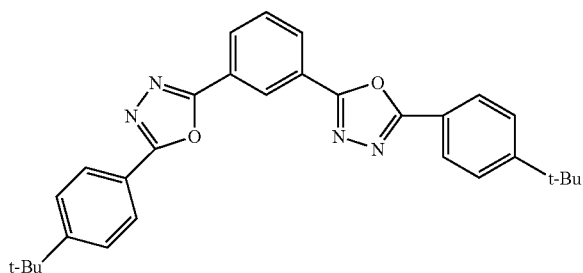

The electron transporting co-host in the present invention also may be selected from substituted 1,2,4-triazoles. An example of a useful triazole is 3-phenyl-4-(1-naphtyl)-5-phenyl-1,2,4-triazole represented by formula (22):

(22)

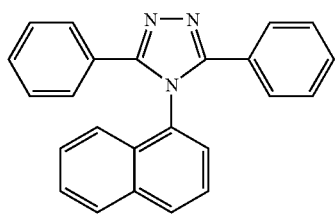

The electron transporting co-host in the present invention also may be selected from substituted 1,3,5-triazines. Examples of suitable materials are:
2,4,6-tris(diphenylamino)-1,3,5-triazine;
2,4,6-tricarbazolo-1,3,5-triazine;
2,4,6-tris(N-phenyl-2-naphthylamino)-1,3,5-triazine;
2,4,6-tris(N-phenyl-1-naphthylamino)-1,3,5-triazine;
4,4',6,6'-tetraphenyl-2,2'-bi-1,3,5-triazine;
2,4,6-tris([1,1':3',1''-terphenyl]-5'-yl)-1,3,5-triazine.

The optimum concentration of the electron transporting co-host in the present invention may be determined by experimentation and may be within the range from 40 to 90 weight %, and is often found to be in the range from 70 to 85 weight %.

As described previously, an OLED device employing a phosphorescent emitter may include at least one exciton blocking layer, 108 (FIG. 1), placed adjacent the light emitting layer 109 on the anode side, to help confine triplet excitons to the light emitting layer comprising co-hosts and a phosphorescent emitter. In order that the exciton blocking layer be capable of confining triplet excitons, the material or materials of this layer should have triplet energies that exceed that of the phosphorescent emitter. Otherwise, if the triplet energy level of any material in the layer adjacent the light emitting layer is lower than that of the phosphorescent emitter, often that material will quench excited states in the light emitting layer, decreasing device luminous efficiency. In some cases it is also desirable that the exciton blocking layer also help to confine electron-hole recombination events to the light emitting layer by blocking the escape of electrons from the light emitting layer into the exciton blocking layer. In order that the exciton blocking layer have this electron blocking property, the material or materials of this layer should have solid-state electron affinities that that are less than the electron affinities of the materials in the light emitting layer by at least 0.1 eV and preferably by at least 0.2 eV.

We have found that luminous yield and power efficiency in the OLED device employing co-hosts and a phosphorescent emitter in the light emitting layer can be improved significantly if the selected exciton blocking material or materials have a triplet energy greater or equal to 2.5 eV.

Triplet energy is conveniently measured by any of several means, as discussed for instance in S. L. Murov, I. Carmichael, and G. L. Hug, *Handbook of Photochemistry*, 2nd ed. (Marcel Dekker, N.Y., 1993).

The triplet state of a compound can also be calculated. The triplet state energy for a molecule is obtained as the difference between the ground state energy (E(gs)) of the molecule and the energy of the lowest triplet state (E(ts)) of the molecule, both given in eV. These energies are obtained using the B3LYP method as implemented in the Gaussian 98 (Gaussian, Inc., Pittsburgh, Pa.) computer program. The basis set for use with the B3LYP method is defined as follows: MIDI! for all atoms for which MIDI! is defined, 6-31G* for all atoms defined in 6-31G* but not in MIDI!, and either the LACV3P or the LANL2DZ basis set and pseudopotential for atoms not defined in MIDI! or 6-31G*, with LACV3P being the preferred method. For any remaining atoms, any published basis set and pseudopotential may be used. MIDI!, 6-31 G* and LANL2DZ are used as implemented in the Gaussian98 computer code and LACV3P is used as implemented in the Jaguar 4.1 (Schrodinger, Inc., Portland Oreg.) computer code. The energy of each state is computed at the minimum-energy geometry for that state. The difference in energy between the two states is further modified by equation (1) to give the triplet state energy (E(t)):

$$E(t)=0.84*(E(ts)-E(gs))+0.35 \qquad \text{(eq. 1)}.$$

For polymeric or oligomeric materials, it is sufficient to compute the triplet energy over a monomer or oligomer of sufficient size so that additional units do not substantially change the computed triplet energy.

The calculated values for the triplet state energy of a given compound may typically show some deviation from the experimental values. Thus, the calculations should be used only as a rough guide in the selection of appropriate materials.

The exciton blocking layer can be between 1 and 500 nm thick and suitably between 10 and 300 nm thick. Thicknesses in this range are relatively easy to control in manufacturing.

In addition to having high triplet energy, the exciton blocking layer 108 must be capable of transporting holes to the light emitting layer 109.

A hole transporting material deposited in said exciton blocking layer between the anode and the light emitting layer may be the same or different from a hole transporting compound used as a co-host according to the invention provided that the triplet energy of the exciton blocking material is greater or equal to 2.5 eV. The exciton blocking layer may include more than one compound, deposited as a blend or divided into separate layers.

The exciton blocking material can comprise compounds containing one or more triarylamine groups, and the triplet energy of these compounds exceeds that of the phosphorescent material and is greater or equal to 2.5 eV. In order to meet such triplet energy requirements said compounds should not contain aromatic fused rings (e.g. naphthalene).

The substituted triarylamines that function as the exciton blocking material in the present invention may be selected from compounds having the chemical formula (23):

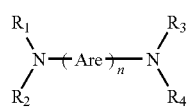

(23)

In formula (23), Are is independently selected from alkyl, substituted alkyl, aryl, or substituted aryl group;

$R_1$-$R_4$ are independently selected aryl groups;

provided that Are and $R_1$-$R_4$ do not include aromatic hydrocarbon fused rings; and n is an integer of from 1 to 4.

In one suitable embodiment the exciton blocking material comprises a material of formula (24):

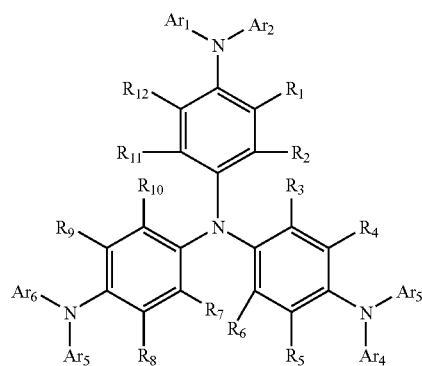

(24)

wherein $Ar_1$-$Ar_6$ independently represent aromatic groups, for example, phenyl groups or tolyl groups;

$R_1$-$R_{12}$ independently represent hydrogen or independently selected substituent, for example a alkyl group containing from 1 to 4 carbon atoms, an aryl group, or a substituted aryl group;

provided that $R_1$-$R_{12}$ and $Ar_5$-$Ar_{10}$ do not contain aromatic hydrocarbon fused rings.

Examples of materials useful in the exciton blocking layer 108 include, but are not limited to:

4,4',4''-tris[(3-methylphenyl)phenylamino]triphenylamine (MTDATA);

4,4',4''-tris(N,N-diphenyl-amino)triphenylamine (TDATA);

N,N-bis[2,5-dimethyl-4-[(3-methylphenyl)phenylamino] phenyl]-2,5-dimethyl-N'-(3-methylphenyl)-N'-phenyl-1, 4-benzenediamine.

In one desirable embodiment the material in the exciton blocking layer is selected from formula (25):

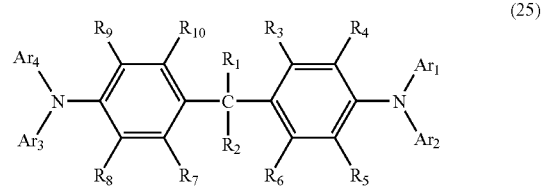

(25)

In formula (25), $R_1$ and $R_2$ represent substituents, provided that $R_1$ and $R_2$ can join to form a ring. For example, $R_1$ and $R_2$ can be methyl groups or join to form a cyclohexyl ring. $Ar_1$-$Ar_4$ represent independently selected aromatic groups, for example phenyl groups or tolyl groups. $R_3$-$R_{10}$ independently represent hydrogen, alkyl, substituted alkyl, aryl, substituted aryl group. In one desirable embodiment, $R_1$-$R_2$, $Ar_1$-$Ar_4$ and $R_3$-$R_{10}$ do not contain fused aromatic rings.

Some non-limiting examples of such materials are:

1,1-Bis(4-(N,N-di-p-tolylamino)phenyl)cyclohexane (TAPC);

1,1-Bis(4-(N,N-di-p-tolylamino)phenyl)cyclopentane;

4,4'-(9H-fluoren-9-ylidene)bis[N,N-bis(4-methylphenyl)-benzenamine;

1,1-Bis(4-(N,N-di-p-tolylamino)phenyl)-4-phenylcyclohexane;

1,1-Bis(4-(N,N-di-p-tolylamino)phenyl)-4-methylcyclohexane;

1,1-Bis(4-(N,N-di-p-tolylamino)phenyl)-3-phenylpropane;

Bis[4-(N,N-diethylamino)-2-methylphenyl](4-methylpenyl) methane;

Bis[4-(N,N-diethylamino)-2-methylphenyl](4-methylphenyl)ethane;

4-(4-Diethylaminophenyl)triphenylmethane;

4,4'-Bis(4-diethylaminophenyl)diphenylmethane.

A material that satisfies the requirements for the exciton blocking layer in the present invention is TAPC. The triplet energy is approximately equal to that of the structurally related compound, triphenylamine, namely 3.0 eV (S. L. Murov, I. Carmichael, and G. L. Hug, *Handbook of Photochemistry*, 2$^{nd}$ ed. (Marcel Dekker, N.Y., 1993)). The triplet energy of a green phosphorescent material is typically about 2.5 eV, and the triplet energy of a blue phosphorescent material can be about 2.8 eV. Thus, TAPC meets the requirement that the triplet energy of the exciton blocking layer exceeds 2.5 eV provided that it is used with a green phosphorescent material or a blue phosphorescent material whose triplet energy is below 3.0 eV. The requirement is also met if the triplet energy of the phosphorescent material is yet lower, as is usually the case if the characteristic phosphorescence is yellow, orange, or red. An example of a compound that fails to satisfy the triplet energy requirements for the exciton blocking material is NPB.

In one suitable embodiment the exciton blocking material comprises a material of formula (26):

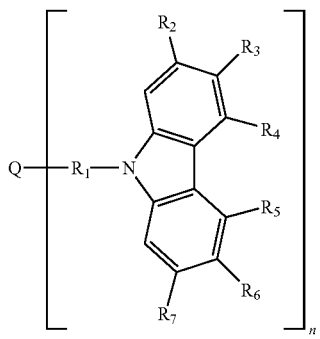

(26)

wherein n is an integer from 1 to 4;
Q is N, C, aryl, or substituted aryl group;
$R_1$ is phenyl, substituted phenyl, biphenyl, substituted biphenyl, aryl or substituted aryl;
$R_2$ through $R_7$ are independently hydrogen, alkyl, phenyl or substituted phenyl, aryl amine, carbazole, or substituted carbazole; provided that $R_2$-$R_7$ do not contain aromatic hydrocarbon fused rings.

It is further desirable that the exciton blocking material is selected from formula (27):

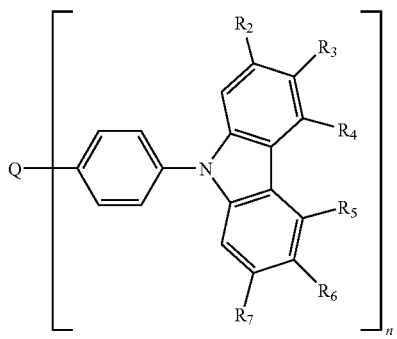

(27)

wherein n is an integer from 1 to 4;
Q is N, C, aryl, or substituted aryl;
$R_2$ through $R_7$ are independently hydrogen, alkyl, phenyl or substituted phenyl, aryl amine, carbazole, provided that $R_2$-$R_7$ do not contain aromatic hydrocarbon fused rings.

Some non-limiting examples of such materials are:
4-(9H-carbazol-9-yl)-N,N-bis[4-(9H-carbazol-9-yl)phenyl]-benzenamine (TCTA);
4-(3-phenyl-9H-carbazol-9-yl)-N,N-bis[4(3-phenyl-9H-carbazol-9-yl)phenyl]-benzenamine;
9,9'-[5'-[4-(9H-carbazol-9-yl)phenyl][1,1':3',1''-terphenyl]-4,4''-diyl]bis-9H-carbazole.

In one suitable embodiment the exciton blocking material comprises a material of formula (28):

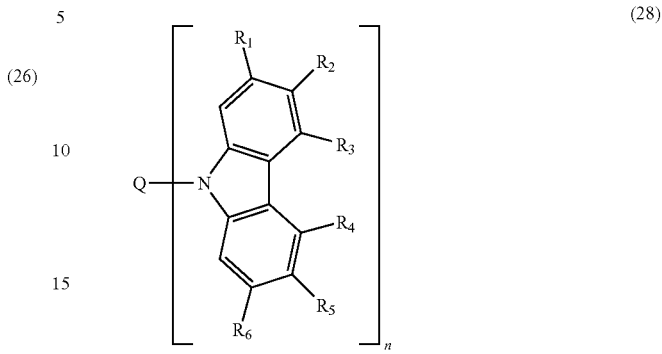

(28)

wherein n is an integer from 1 to 4;
Q is phenyl, substituted phenyl, biphenyl, substituted biphenyl, aryl, or substituted aryl group;
$R_1$ through $R_6$ are independently hydrogen, alkyl, phenyl or substituted phenyl, aryl amine, carbazole, or substituted carbazole;
provided that $R_1$-$R_6$ do not contain aromatic hydrocarbon fused rings.

Non-limiting examples of suitable materials are:
9,9'-(2,2'-dimethyl[1,1'-biphenyl]-4,4'-diyl)bis-9H-carbazole (CDBP);
9,9'-[1,1'-biphenyl]-4,4'-diyl)bis-9H-carbazole (CBP);
9,9'-(1,3-phenylene)bis-9H-carbazole (mCP);
9,9'-(1,4-phenylene)bis-9H-carbazole;
9,9',9''-(1,3,5-benzenetriyl)tris-9H-carbazole;
9,9'-(1,4-phenylene)bis[N,N,N',N'-tetraphenyl-9H-carbazole-3,6-diamine;
9-[4-(9H-carbazol-9-yl)phenyl]-N,N-diphenyl-9H-carbazol-3-amine;
9,9'-(1,4-phenylene)bis[N,N-diphenyl-9H-carbazol-3-amine;
9-[4-(9H-carbazol-9-yl)phenyl]-N,N,N',N'-tetraphenyl-9H-carbazole-3,6-diamine;
9-phenyl-9H-carbazol.

Exciton blocking layer 108 can be used alone or with a hole-transporting layer 107.

Use of an exciton blocking layer in combination with the hole transporting and electron transporting co-host materials and at least one phosphorescent emitter as described herein has been found to provide very high luminous efficiency and low drive voltage.

In one embodiment, an exciton blocking layer is used with a light emitting layer comprising a phosphorescent light emitting material and co-hosts for the light emitting material, and a hole injecting layer adjacent to the anode. Conveniently, the hole injecting layer includes a plasma-deposited fluorocarbon polymer as described in U.S. Pat. No. 6,208,075. In a further embodiment, an exciton blocking layer is used with a light emitting layer comprising a phosphorescent light emitting material and co-hosts for the light emitting material, and a hole blocking layer 110 on the cathode side of the light emitting layer.

According to the present invention, the light emitting layer 109 of the EL device comprises hole- and electron transporting co-host materials and one or more phosphorescent emitters. The light emitting phosphorescent guest material(s) is typically present in an amount of from 1 to 20 by weight % of the light emitting layer, and conveniently from 2 to 8% by weight of the light emitting layer. In some embodiments, the phosphorescent complex guest material(s) may be attached to one or more host materials. The host materials may further be polymers. For convenience, the phosphorescent complex guest material may be referred to herein as a phosphorescent material or emitter.

Particularly useful phosphorescent materials are described by formula (29) below:

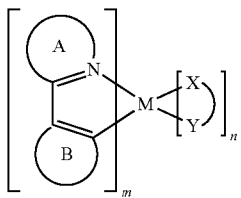

(29)

wherein:

A is a substituted or unsubstituted heterocyclic ring containing at least one nitrogen atom;

B is a substituted or unsubstituted aromatic or heteroaromatic ring, or ring containing a vinyl carbon bonded to M;

X-Y is an anionic bidentate ligand;

m is an integer from 1 to 3 and n in an integer from 0 to 2 such that m+n=3 for M=Rh or Ir; or m is an integer from 1 to 2 and n in an integer from 0 to 1 such that m+n=2 for M=Pt or Pd.

Compounds according to formula (29) may be referred to as C,N- (or C^N-) cyclometallated complexes to indicate that the central metal atom is contained in a cyclic unit formed by bonding the metal atom to carbon and nitrogen atoms of one or more ligands. Examples of heterocyclic ring A in formula (29) include substituted or unsubstituted pyridine, quinoline, isoquinoline, pyrimidine, indole, indazole, thiazole, and oxazole rings. Examples of ring B in formula (29) include substituted or unsubstituted phenyl, napthyl, thienyl, benzothienyl, furanyl rings. Ring B in formula (29) may also be a N-containing ring such as pyridine, with the proviso that the N-containing ring bonds to M through a C atom as shown in formula (29) and not the N atom.

An example of a tris-C,N-cyclometallated complex according to formula (29) with m=3 and n=0 is tris(2-phenyl-pyridinato-N,C$^{2'}$-)Iridium (III), shown below in stereodiagrams as facial (fac-) or meridional (mer-) isomers.

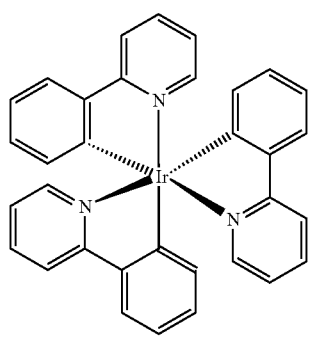

Fac

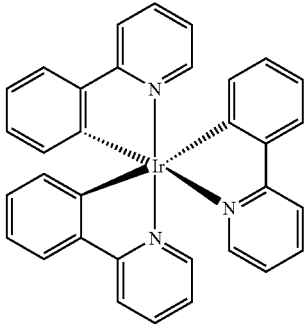

Mer

Generally, facial isomers are preferred since they are often found to have higher phosphorescent quantum yields than the meridional isomers. Additional examples of tris-C,N-cyclometallated phosphorescent materials according to formula (29) are tris(2-(4'-methylphenyl)pyridinato-N,C$^{2'}$)Iridium (III), tris(3-phenylisoquinolinato-N,C$^{2'}$)Iridium(III), tris(2-phenylquinolinato-N,C$^{2'}$)Iridium(III), tris(1-phenyliso-quinolinato-N,C$^{2'}$)Iridium(III), tris(1-(4'-methylphenyl)isoquinolinato-N,C$^{2'}$)Iridium(III), tris(2-(4',6'-diflourophenyl)-pyridinato-N,C$^{2'}$)Iridium(III), tris(2-((5'-phenyl)-phenyl)pyridinato-N,C$^{2'}$)Iridium(III), tris(2-(2'-benzothienyl)pyridinato-N,C$^{3'}$)Iridium(III), tris(2-phenyl-3,3'dimethyl)indolato-N,C$^{2'}$)Ir(III), tris(1-phenyl-1H-indazolato-N,C$^{2'}$)Ir(III).

Tris-C,N-cyclometallated phosphorescent materials also include compounds according to formula (29) wherein the monoanionic bidentate ligand X-Y is another C,N-cyclometallating ligand. Examples include bis(1-phenylisoquinolinato-N,C$^{2'}$)(2-phenylpyridinato-N,C$^{2'}$)Iridium(III) and bis (2-phenylpyridinato-N,C$^{2'}$) (1-phenylisoquinolinato-N,C$^{2'}$) Iridium(III). Synthesis of such tris-C,N-cyclometallated complexes containing two different C,N-cyclometallating ligands may be conveniently synthesized by the following steps. First, a bis-C,N-cyclometallated diiridium dihalide complex (or analogous dirhodium complex) is made according to the method of Nonoyama (Bull. Chem. Soc. Jpn., 47, 767 (1974)). Secondly, a zinc complex of the second, dissimilar C,N-cyclometallating ligand is prepared by reaction of a zinc halide with a lithium complex or Grignard reagent of the cyclometallating ligand. Third, the thus formed zinc complex of the second C,N-cyclometallating ligand is reacted with the previously obtained bis-C,N-cyclometallated diiridium dihalide complex to form a tris-C,N-cyclometallated complex containing the two different C,N-cyclometallating ligands. Desirably, the thus obtained tris-C,N-cyclometallated complex containing the two different C,N-cyclometallating ligands may be converted to an isomer wherein the C atoms bonded to the metal (e.g. Ir) are all mutually cis by heating in a suitable solvent such as dimethyl sulfoxide.

Suitable phosphorescent materials according to formula (29) may in addition to the C,N-cyclometallating ligand(s) also contain monoanionic bidentate ligand(s) X-Y that are not C,N-cyclometallating. Common examples are beta-diketonates such as acetylacetonate, and Schiff bases such as picolinate. Examples of such mixed ligand complexes according to formula (29) include bis(2-phenylpyridinato-N,C$^{2'}$)Iridium (III)(acetylacetonate), bis(2-(2'-benzothienyl)pyridinato-N, C$^{3'}$)Iridium(III)(acetylacetonate), and bis(2-(4',6'-diflourophenyl)-pyridinato-N,C$^{2'}$)Iridium(III)(picolinate).

Other important phosphorescent materials according to formula (29) include C,N-cyclometallated Pt(II) complexes such as cis-bis(2-phenylpyridinato-N,C$^{2'}$)platinum(II), cis-bis(2-(2'-thienyl)pyridinato-N,C$^{3'}$)platinum(II), cis-bis(2-(2'-thienyl)quinolinato-N,C$^{5'}$)platinum(II), or (2-(4',6'-difluorophenyl)pyridinato-N,C$^{2'}$)platinum (II) (acetylacetonate).

The emission wavelengths (color) of C,N-cyclometallated phosphorescent materials according to formula (29) are governed principally by the lowest energy optical transition of the complex and hence by the choice of the C,N-cyclometallating ligand. For example, 2-phenyl-pyridinato-N,C$^{2'}$ complexes are typically green emissive while 1-phenyl-isoquinolinolato-N,C$^{2'}$ complexes are typically red emissive. In the case of complexes having more than one C,N-cyclometallating ligand, the emission will be that of the ligand having the property of longest wavelength emission. Emission wavelengths may be further shifted by the effects of substituent groups on the C,N-cyclometallating ligands. For example, substitution of electron donating groups at appropriate positions on the N-containing ring A or electron accepting groups on the C-containing ring B tend to blue-shift the emission relative to the unsubstituted C,N-cyclometallated ligand complex. Selecting a monodentate anionic ligand X,Y in formula (29) having more electron accepting properties also tends to blue-shift the emission of a C,N-cyclometallated ligand complex. Examples of complexes having both monoanionic bidentate ligands possessing electron accepting properties and electron accepting substituent groups on the C-containing ring B include bis(2-(4',6'-difluorophenyl)-pyridinato-N,C$^{2'}$)iridium(III)(picolinate) and bis(2-(4',6'-difluorophenyl)-pyridinato-N,C$^{2'}$)iridium(III)(tetrakis(1-pyrazolyl)borate).

The central metal atom in phosphorescent materials according to formula (29) may be Rh or Ir (m+n=3) and Pd or Pt (m+n=2). Preferred metal atoms are Ir and Pt since they tend to give higher phosphorescent quantum efficiencies according to the stronger spin-orbit coupling interactions generally obtained with elements in the third transition series.

In addition to bidentate C,N-cyclometallating complexes represented by formula 29, many suitable phosphorescent emitters contain multidentate C,N-cyclometallating ligands. Phosphorescent emitters having tridentate ligands suitable for use in the present invention are disclosed in U.S. Pat. No. 6,824,895 B1 and U.S. Ser. No. 10/729,238 (pending) and references therein, incorporated in their entirety herein by reference. Phosphorescent emitters having tetradentate ligands suitable for use in the present invention are described by the following formulae:

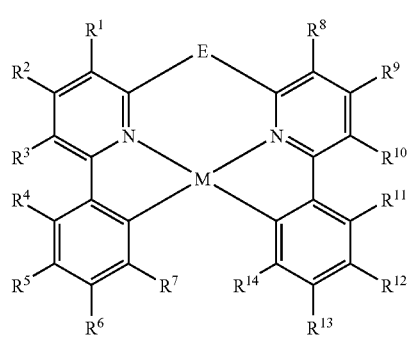

(XX)

-continued

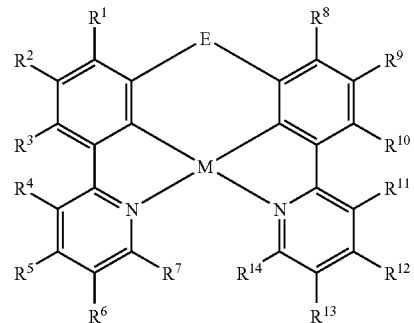

(YY)

wherein:
M is Pt or Pd;
R$^1$-R$^7$ represent hydrogen or independently selected substituents, provided that R$^1$ and R$^2$, R$^2$ and R$^3$, R$^3$ and R$^4$, R$^4$ and R$^5$, R$^5$ and R$^6$, as well as R$^6$ and R$^7$ may join to form a ring group;
R$^8$-R$^{14}$ represent hydrogen or independently selected substituents, provided that R$^8$ and R$^9$, R$^9$ and R$^{10}$, R$^{10}$ and R$^{11}$, R$^{11}$ and R$^{12}$, R$^{12}$ and R$^{13}$, as well as R$^{13}$ and R$^{14}$, may join to form a ring group;
E represents a bridging group selected from the following:

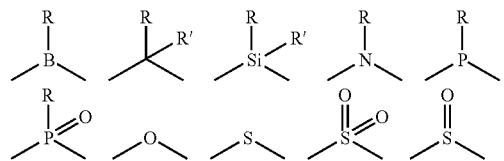

wherein R and R' represent hydrogen or independently selected substituents; provided R and R' may combine to form a ring group.

In one desirable embodiment, the tetradentate C,N-cyclometallated phosphorescent emitter suitable for use in the present invention is represented by the following formula:

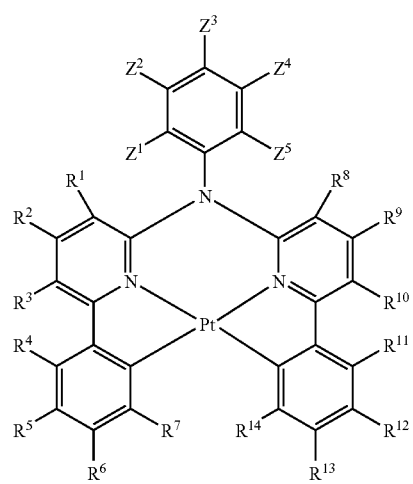

(ZZ)

wherein,

R$^1$-R$^7$ represent hydrogen or independently selected substituents, provided that R$^1$ and R$^2$, R$^2$ and R$^3$, R$^3$ and R$^4$, R$^4$ and R$^5$, R$^5$ and R$^6$, as well as R$^6$ and R$^7$ may combine to form a ring group;

R$^8$-R$^{14}$ represent hydrogen or independently selected substituents, provided that R$^8$ and R$^9$, R$^9$ and R$^{10}$, R$^{10}$ and R$^{11}$, R$^{11}$ and R$^{12}$, R$^{12}$ and R$^{13}$, as well as R$^{13}$ and R$^{14}$ may combine to form a ring group;

Z$^1$-Z$^5$ represent hydrogen or independently selected substituents, provided that Z$^1$ and Z$^2$, Z$^2$ and Z$^3$, Z$^3$ and Z$^4$, as well as Z$^4$ and Z$^5$ may combine to form a ring group.

Specific examples of phosphorescent emitters having tetradentate C,N-cyclometallating ligands suitable for use in the present invention include compounds X, Y, and Z represented below.

Compound X

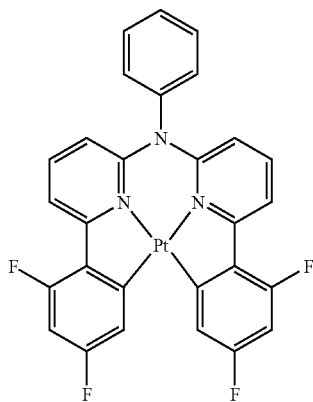

Compound Y

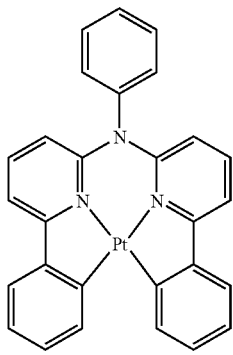

Compound Z

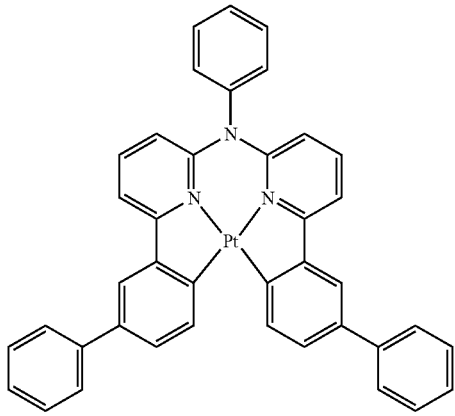

Phosphorescent emitters having tetradentate C,N-cyclometallating ligands may be synthesized by reacting the tetradentate C,N-cyclometallating ligand with a salt of the desired metal, such as K$_2$PtCl$_4$, in a proper organic solvent such as glacial acetic acid to form the phosphorescent emitter having tetradentate C,N-cyclometallating ligands. A tetraakylammonium salt such as tetrabutylammonium chloride can be used as a phase transfer catalyst to accelerate the reaction.

Other phosphorescent materials that do not involve C,N-cyclometallating ligands are known. Phosphorescent complexes of Pt(II), Ir(I), and Rh(I) with maleonitriledithiolate have been reported (C. E. Johnson et al., *J. Am. Chem. Soc.*, 105,1795 (1983)). Re(I) tricarbonyl diimine complexes are also known to be highly phosphorescent (M. Wrighton and D. L. Morse, *J. Am. Chem. Soc.*, 96, 998 (1974); D. J. Stufkens, *Comments Inorg. Chem.*, 13, 359 (1992); V. W. W. Yam, *Chem. Commun.*, 789 (2001)). Os(II) complexes containing a combination of ligands including cyano ligands and bipyridyl or phenanthroline ligands have also been demonstrated in a polymer OLED (Y. Ma et al., *Synthetic Metals*, 94, 245 (1998)).

Porphyrin complexes such as 2,3,7,8,12,13,17,18-octaethyl-21H, 23H-porphine platinum(II) are also useful phosphorescent materials.

Still other examples of useful phosphorescent materials include coordination complexes of the trivalent lanthanides such as Th$^{3+}$ and Eu$^{3+}$ (J. Kido et al., *Chem. Lett.*, 657 (1990); *J. Alloys and Compounds*, 192, 30 (1993); *Jpn. J. Appl. Phys.*, 35, L394 (1996) and *Appl. Phys. Lett.*, 65, 2124 (1994)).

Additional information on suitable phosphorescent materials and synthetic methods, incorporated herein by reference, can be found in U.S. Pat. No. 6,303,238 B1, WO 00/57676, WO 00/70655, WO 01/41512 A1, US 2002/0182441 A1, US 2003/0017361 A1, US 2003/0072964 A1, U.S. Pat. No. 6,413,656 B1, U.S. Pat. No. 6,687,266 B1, US 2004/0086743 A1, US 2004/0121184 A1, US 2003/0059646 A1, US 2003/0054198 A1, EP 1 239 526 A2, EP 1 238 981 A2, EP 1 244 155 A2, US 2002/0100906 A1, US 2003 /0068526 A1, US 2003/0068535 A1, JP 2003073387A, JP 2003 073388A, U.S. Pat. No. 6,677,060 B2, US 2003/0235712 A1, US 2004/0013905 A1, U.S. Pat. No. 6,733,905 B2, U.S. Pat. No. 6,780,528 B2, US 2003/0040627 A1, JP 2003059667A, JP 2003073665A, US 2002/0121638 A1, EP 1371708A1, US 2003/010877 A1, WO 03/040256 A2, US 2003/0096138 A1, US 2003/0173896 A1, U.S. Pat. No. 6,670,645 B2, US 2004/0068132 A1, WO 2004/015025 A1, US 2004/0072018 A1, US 2002/0134984 A1, WO 03/079737 A2, WO 2004/020448 A1, WO 03/091355 A2, U.S. Ser. No. 10/729,402, U.S. Ser. No. 10/729,712, U.S. Ser. No. 10/729,738, U.S. Ser. No. 10/729, 238, U.S. Ser. No. 10/729,246 (now allowed), U.S. Ser. No. 10/729,207 (now allowed), U.S. Ser. No. 10/729,263 (now allowed), U.S. Ser. No. 10/879,412, and U.S. Ser. No. 10/879, 657.

In one suitable embodiment the EL device includes a means for emitting white light, which may include complimentary emitters, a white emitter, or a filtering means. The device may also include a fluorescent emitting material.

In one desirable embodiment the EL device is part of a display device. In another suitable embodiment the EL device is part of an area lighting device.

Unless otherwise specifically stated, use of the term "substituted" or "substituent" means any group or atom other than hydrogen. Unless otherwise provided, when a group (including a compound or complex) containing a substitutable hydrogen is referred to, it is also intended to encompass not only the unsubstituted form, but also form further substituted derivatives with any substituent group or groups as herein mentioned, so long as the substituent does not destroy properties necessary for utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy)propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl) ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron. such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain the desired desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

It is well within the skill of the art to determine whether a particular group is electron donating or electron accepting. The most common measure of electron donating and accepting properties is in terms of Hammett σ values. Hydrogen has a Hammett σ value of zero, while electron donating groups have negative Hammett σ values and electron accepting groups have positive Hammett σ values. Lange's handbook of Chemistry, $12^{th}$ Ed., McGraw Hill, 1979, Table 3-12, pp. 3-134 to 3-138, here incorporated by reference, lists Hammett σ values for a large number of commonly encountered groups. Hammett σ values are assigned based on phenyl ring substitution, but they provide a practical guide for qualitatively selecting electron donating and accepting groups.

Suitable electron donating groups may be selected from —R', —OR', and —NR'(R") where R' is a hydrocarbon containing up to 6 carbon atoms and R" is hydrogen or R'. Specific examples of electron donating groups include methyl, ethyl, phenyl, methoxy, ethoxy, phenoxy, —N(CH$_3$)$_2$, —N(CH$_2$CH$_3$)$_2$, —NHCH$_3$, —N(C$_6$H$_5$)$_2$, —N(CH$_3$)(C$_6$H$_5$), and —NHC$_6$H$_5$.

Suitable electron accepting groups may be selected from the group consisting of cyano, α-haloalkyl, α-halo alkoxy, amido, sulfonyl, carbonyl, carbonyloxy and oxycarbonyl substituents containing up to 10 carbon atoms. Specific examples include —CN, —F, —CF$_3$, —OCF$_3$, —CONHC$_6$H$_5$, —SO$_2$C$_6$H$_5$, —COC$_6$H$_5$, —CO$_2$C$_6$H$_5$, and —OCOC$_6$H$_5$.

General Device Architecture

The present invention can be employed in many OLED device configurations using small molecule materials, oligomeric materials, polymeric materials, or combinations thereof. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. The essential requirements of an OLED are an anode, a cathode, and an organic light emitting layer located between the anode and cathode. Additional layers may be employed as more fully described hereafter.

A typical structure according to the present invention and especially useful for a small molecule device, is shown in FIG. 1 and is comprised of a substrate 101, an anode 103, a hole injecting layer 105, a hole transporting layer 107, an exciton blocking layer 108, a light emitting layer 109, a hole blocking layer 110, an electron transporting layer 111, and a cathode 113. These layers are described in detail below. Note that the substrate 101 may alternatively be located adjacent to the cathode 113, or the substrate 101 may actually constitute the anode 103 or cathode 113. The organic layers between the anode 103 and cathode 113 are conveniently referred to as the organic EL element. Also, the total combined thickness of the organic layers is desirably less than 500 nm.

The anode 103 and cathode 113 of the OLED are connected to a voltage/current source 150 through electrical conductors 160. The OLED is operated by applying a potential between the anode 103 and cathode 113 such that the anode 103 is at a more positive potential than the cathode 113. Holes are injected into the organic EL element from the anode 103 and electrons are injected into the organic EL element at the cathode 113. Enhanced device stability can sometimes be achieved when the OLED is operated in an AC mode where, for some time period in the AC cycle, the potential bias is reversed and no current flows. An example of an AC driven OLED is described in U.S. Pat. No. 5,552,678.

Substrate

The OLED device of this invention is typically provided over a supporting substrate 101 where either the cathode 113 or anode 103 can be in contact with the substrate. The electrode in contact with the substrate 101 is conveniently referred to as the bottom electrode. Conventionally, the bottom electrode is the anode 103, but this invention is not limited to that configuration. The substrate 101 can either be light transmissive or opaque, depending on the intended direction of light emission. The light transmissive property is desirable for viewing the EL emission through the substrate 101. Transparent glass or plastic is commonly employed in such cases. The substrate 101 can be a complex structure comprising multiple layers of materials. This is typically the case for active matrix substrates wherein TFTs are provided below the OLED layers. It is still necessary that the substrate 101, at least in the emissive pixelated areas, be comprised of largely transparent materials such as glass or polymers. For applications where the EL emission is viewed through the top electrode, the transmissive characteristic of the bottom support is immaterial, and therefore the substrate can be light transmissive, light absorbing or light reflective. Substrates for use in this case include, but are not limited to, glass, plastic, semiconductor materials such as silicon, ceramics, and circuit board materials. Again, the substrate 101 can be a complex structure comprising multiple layers of materials such as found in active matrix TFT designs. It is necessary to provide in these device configurations a light-transparent top electrode.

Anode

When the desired electroluminescent light emission (EL) is viewed through the anode, the anode 103 should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode 103. For applications where EL emission is viewed only through the cathode 113, the transmissive characteristics of the anode 103 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize short circuits or enhance reflectivity.

Cathode

When light emission is viewed solely through the anode 103, the cathode 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One useful cathode material is comprised of a Mg:Ag alloy wherein the percentage of silver is in the range of 1 to 20%, as described in U.S. Pat. No. 4,885,221. Another suitable class of cathode materials includes bilayers comprising the cathode and a thin electron injecting layer (EIL) in contact with an organic layer (e.g., an electron transporting layer (ETL)), the cathode being capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. An ETL material doped with an alkali metal, for example, Li-doped Alq, is another example of a useful EIL. Other useful cathode material sets include, but are not limited to, those disclosed in U.S. Pat. Nos. 5,059,861, 5,059,862, and 6,140,763.

When light emission is viewed through the cathode, the cathode 113 must be transparent or nearly transparent. For such applications, metals must be thin or one must use transparent conductive oxides, or a combination of these materials. Optically transparent cathodes have been described in more detail in U.S. Pat. Nos. 4,885,211, 5,247,190, JP 3,234,963, U.S. Pat. Nos. 5,703,436,5,608,287, 5,837,391, 5,677,572, 5,776,622, 5,776,623, 5,714,838, 5,969,474, 5,739,545, 5,981,306, 6,137,223, 6,140,763 6,172,459, EP 1 076 368, U.S. Pat. Nos. 6,278,236, and 6,284,3936. Cathode materials are typically deposited by any suitable method such as evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Hole Injecting Layer (HIL)

A hole injecting layer 105 may be provided between anode 103 and hole transporting layer 107. The hole injecting layer can serve to improve the film formation property of subsequent organic layers and to facilitate injection of holes into the hole transporting layer 107. Suitable materials for use in the hole injecting layer 105 include, but are not limited to, porphyrinic compounds as described in U.S. Pat. No. 4,720, 432, plasma-deposited fluorocarbon polymers as described in U.S. Pat. No. 6,208,075, and some aromatic amines, for example, MTDATA (4,4',4''-tris[(3-methylphenyl)phenylamino]triphenylamine). Alternative hole injecting materials reportedly useful in organic EL devices are described in EP 0 891 121 A1 and EP 1 029 909 A1. A hole injection layer is conveniently used in the present invention, and is desirably a plasma-deposited fluorocarbon polymer.

The thickness of a hole injection layer containing a plasma-deposited fluorocarbon polymer can be in the range of 0.2 nm to 15 nm and suitably in the range of 0.3 to 1.5 nm.

Hole Transporting Layer (HTL)

In addition to the emissive layer, it is usually advantageous to have a hole transporting layer deposited between the anode and the emissive layer. A hole transporting material deposited in said hole transporting layer between the anode and the light emitting layer may be the same or different from a hole transporting compound used as a co-host or in exciton blocking layer according to the invention. The hole transporting layer may optionally include a hole injection layer. The hole transporting layer may include more than one hole transporting compound, deposited as a blend or divided into separate layers.

The hole transporting layer of the organic EL device contains at least one hole transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamine's substituted with one or more vinyl radicals and/or comprising at least one active hydrogen containing group are disclosed by Brantley et al. in U.S. Pat. Nos. 3,567,450 and 3,658,520.

A more preferred class of aromatic tertiary amines is those which include at least two aromatic tertiary amine moieties as described in U.S. Pat. Nos. 4,720,432 and 5,061,569. Such compounds include those represented by structural formula (30):

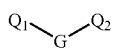

(30)

wherein $Q_1$ and $Q_2$ are independently selected aromatic tertiary amine moieties, and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (30) and containing two triarylamine moieties is represented by structural formula (31):

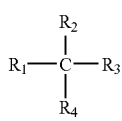

(31)

wherein $R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural formula (32):

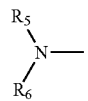

(32)

wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines is the tetraaryldiamines. Desirable tetraaryldiamines include two diarylamino groups, such as indicated by formula (32), linked through an arylene group. Useful tetraaryldiamines include those represented by formula (33):

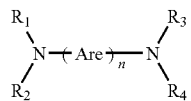

(33)

wherein each Are is an independently selected arylene group, such as a phenylene or anthracene moiety, n is an integer of from 1 to 4, and $R_1$, $R_2$, $R_3$, and $R_4$ are independently selected aryl groups. In a typical embodiment, at least one of $R_1$, $R_2$, $R_3$, and $R_4$ is a polycyclic fused ring structure, e.g., a naphthalene.

The various alkyl, alkylene, aryl, and arylene moieties of the foregoing structural formulae (30), (31), (32), (33) can each in turn be substituted. Typical substituents include alkyl groups, alkoxy groups, aryl groups, aryloxy groups, and halide such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms, such as cyclopentyl, cyclohexyl, and cycloheptyl ring structures. The aryl and arylene moieties are usually phenyl and phenylene moieties.

The hole transporting layer can be formed of a single tertiary amine compound or a mixture of such compounds. Specifically, one may employ a triarylamine, such as a triarylamine satisfying the formula (31), in combination with a tetraaryldiamine, such as indicated by formula (33). Illustrative of useful aromatic tertiary amines are the following:

1,1-Bis(4-di-p-tolylaminophenyl)cyclohexane (TAPC);
1,1-Bis(4-di-p-tolylaminophenyl)-4-phenylcyclohexane;
N,N,N',N'-tetraphenyl-4,4'''-diamino-1,1':4',1'':4'',1'''-quaterphenyl;
Bis(4-dimethylamino-2-methylphenyl)phenylmethane;
1,4-bis[2-[4-[N,N-di(p-tolyl)amino]phenyl]vinyl]benzene (BDTAPVB);
N,N,N',N'-Tetra-p-tolyl-4,4'-diaminobiphenyl;
N,N,N',N'-Tetraphenyl-4,4'-diaminobiphenyl;
N,N,N',N'-tetra-1-naphthyl-4,4'-diaminobiphenyl;
N,N,N',N'-tetra-2-naphthyl-4,4'-diaminobiphenyl;
N-Phenylcarbazole;
4,4'-Bis[N-(1-naphthyl)-N-phenylamino]biphenyl (NPB);
4,4'-Bis[N-(3-methylphenyl)-N-phenylamino]biphenyl (TPD);

4,4'-Bis[N-(1-naphthyl)-N-(2-naphthyl)amino]biphenyl (TNB);
4,4'-Bis[N-(1-naphthyl)-N-phenylamino]p-terphenyl;
4,4'-Bis[N-(2-naphthyl)-N-phenylamino]biphenyl;
4,4'-Bis[N-(3-acenaphthenyl)-N-phenylamino]biphenyl;
1,5-Bis[N-(1-naphthyl)-N-phenylamino]naphthalene;
4,4'-Bis[N-(9-anthryl)-N-phenylamino]biphenyl;
4,4'-Bis[N-(1-anthryl)-N-phenylamino]-p-terphenyl;
4,4'-Bis[N-(2-phenanthryl)-N-phenylamino]biphenyl;
4,4'-Bis[N-(8-fluoranthenyl)-N-phenylamino]biphenyl;
4,4'-Bis[N-(2-pyrenyl)-N-phenylamino]biphenyl;
4,4'-Bis[N-(2-naphthacenyl)-N-phenylamino]biphenyl;
4,4'-Bis[N-(2-perylenyl)-N-phenylamino]biphenyl;
4,4'-Bis[N-(1-coronenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4"-diamino-p-terphenyl;
4,4'-Bis{N-phenyl-N-[4-(1-naphthyl)-phenyl]amino}biphenyl;
2,6-Bis[N,N-di(2-naphthyl)amino]fluorine;
4,4',4"-tris[(3-methylphenyl)phenylamino]triphenylamine (MTDATA);
N,N-bis[2,5-dimethyl-4-[(3-methylphenyl)phenylamino]phenyl]-2,5-dimethyl-N'-(3-methylphenyl)-N'-phenyl-1,4-benzenediamine;
4-(9H-carbazol-9-yl)-N,N-bis[4-(9H-carbazol-9-yl)phenyl]-benzenamine (TCTA);
4-(3-phenyl-9H-carbazol-9-yl)-N,N-bis[4(3-phenyl-9H-carbazol-9-yl)phenyl]-benzenamine;
9,9'-(2,2'-dimethyl[1,1'-biphenyl]-4,4'-diyl)bis-9H-carbazole (CDBP);
9,9'-[1,1'-biphenyl]-4,4'-diyl)bis-9H-carbazole (CBP);
9,9'-(1,3-phenylene)bis-9H-carbazole (mCP);
9-[4-(9H-carbazol-9-yl)phenyl]-N,N-diphenyl-9H-carbazol-3-amine;
9,9'-(1,4-phenylene)bis[N,N-diphenyl-9H-carbazol-3-amine;
9-[4-(9H-carbazol-9-yl)phenyl]-N,N,N',N'-tetraphenyl-9H-carbazole-3,6-diamine.

Another class of useful hole transporting materials includes polycyclic aromatic compounds as described in EP 1 009 041. Tertiary aromatic amines with more than two amine groups may be used including oligomeric materials. In addition, polymeric hole transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

It is also possible for the hole transporting layer to comprise two or more sublayers of differing compositions, the composition of each sublayer being as described above.

The thickness of the hole transporting layer can be between 10 and about 500 nm and suitably between 50 and 300 nm.

Exciton Blocking Layer (EBL)

The exciton blocking layer has been described previously.

Light Emitting Layer (LEL)

The light emitting layer of the invention comprising at least one hole transporting co-host, at least one electron transporting co-host, and at least one phosphorescent emitter has been described previously.

Fluorescent Light-Emitting Materials and Layers (LEL)

In addition to the phosphorescent emitters of this invention, other light emitting materials may be used in the OLED device, including fluorescent materials. Although the term "fluorescent" is commonly used to describe any light emitting material, in this case we are referring to a material that emits light from a singlet excited state. Fluorescent materials may be used in the same layer as the phosphorescent material, in adjacent layers, in adjacent pixels, or any combination. Care must be taken not to select materials that will adversely affect the performance of the phosphorescent materials of this invention. One skilled in the art will understand that concentrations and triplet energies of materials in the same layer as the phosphorescent material or in an adjacent layer must be appropriately set so as to prevent unwanted quenching of the phosphorescence.

As more fully described in U.S. Pat. Nos. 4,769,292 and 5,935,721, the light emitting layer (LEL) of the organic EL element includes a luminescent fluorescent or phosphorescent material where electroluminescence is produced as a result of electron-hole pair recombination. The light emitting layer can be comprised of a single material, but more commonly consists of a host material doped with a guest emitting material or materials where light emission comes primarily from the emitting materials and can be of any color. The host materials in the light emitting layer can be an electron transporting material, as defined below, a hole transporting material, as defined above, or another material or combination of materials that support hole-electron recombination. Fluorescent emitting materials are typically incorporated at 0.01 to 10% by weight of the host material.

The host and emitting materials can be small non-polymeric molecules or polymeric materials such as polyfluorenes and polyvinylarylenes (e.g., poly(p-phenylenevinylene), PPV). In the case of polymers, small-molecule emitting materials can be molecularly dispersed into a polymeric host, or the emitting materials can be added by copolymerizing a minor constituent into a host polymer. Host materials may be mixed together in order to improve film formation, electrical properties, light emission efficiency, operating lifetime, or manufacturability. The host may comprise a material that has good hole transporting properties and a material that has good electron transporting properties.

An important relationship for choosing a fluorescent material as a guest emitting material is a comparison of the excited singlet-state energies of the host and the fluorescent material. It is highly desirable that the excited singlet-state energy of the fluorescent material be lower than that of the host material. The excited singlet-state energy is defined as the difference in energy between the emitting singlet state and the ground state. For non-emissive hosts, the lowest excited state of the same electronic spin as the ground state is considered the emitting state.

Host and emitting materials known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, and 6,020,078.

Metal complexes of 8-hydroxyquinoline and similar derivatives, also known as metal-chelated oxinoid compounds (formula (30)), constitute one class of useful host compounds capable of supporting electroluminescence, and are particularly suitable for light emission of wavelengths longer than 500 nm, e.g., green, yellow, orange, and red.

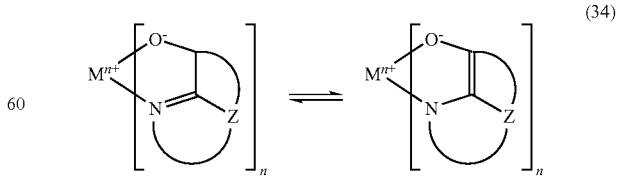

(34)

wherein

M represents a metal;

n is an integer of from 1 to 4; and

Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; a trivalent metal, such aluminum or gallium, or another metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc (II)
CO-4: Bis(2-methyl-8-quinolinolato)aluminum(III)-μ-oxo-bis(2-methyl-8-quinolinolato)aluminum(III)
CO-5: Indium trisoxine [alias, tris(8-quinolinolato)indium]
CO-6: Aluminum tris(5-methyloxine) [alias, tris(5-methyl-8-quinolinolato)aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato)zirconium(IV)]

Derivatives of 9,10-di-(2-naphthyl)anthracene (formula (35)) constitute one class of useful host materials capable of supporting electroluminescence, and are particularly suitable for light emission of wavelengths longer than 400 nm, e.g., blue, green, yellow, orange or red.

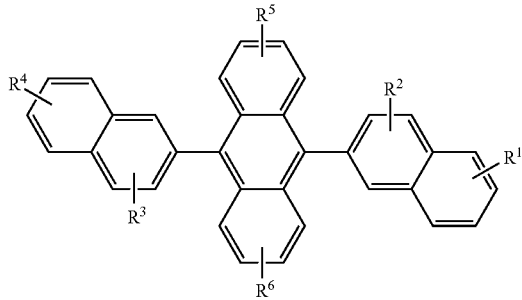

(35)

wherein $R^1$, $R^2$, $R^3$, $R^4$, $R^5$, and $R^6$ represent one or more substituents on each ring where each substituent is individually selected from the following groups:
Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl; pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine, chlorine, bromine or cyano.

Illustrative examples include 9,10-di-(2-naphthyl)anthracene and 2-t-butyl-9,10-di-(2-naphthyl)anthracene. Other anthracene derivatives can be useful as a host in the LEL, including derivatives of 9,10-bis[4-(2,2-diphenylethenyl)phenyl]anthracene.

Benzazole derivatives (formula (36)) constitute another class of useful host materials capable of supporting electroluminescence, and are particularly suitable for light emission of wavelengths longer than 400 nm, e.g., blue, green, yellow, orange or red:

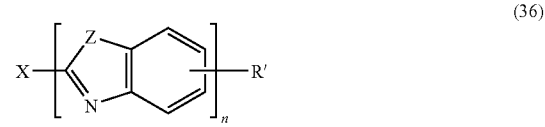

(36)

where:
n is an integer of 3 to 8;
Z is O, NR or S; and
R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and
X is a linkage unit consisting of carbon, alkyl, aryl, substituted alkyl, or substituted aryl, which connects the multiple benzazoles together. X may be either conjugated with the multiple benzazoles or not in conjugation with them. An example of a useful benzazole is 2,2',2"-(1,3,5-phenylene)tris[1-phenyl-1H-benzimidazole] (TPBI).

Styrylarylene derivatives as described in U.S. Pat. No. 5,121,029 and JP 08333569 are also useful hosts for blue emission. For example, 9,10-bis[4-(2,2-diphenylethenyl)phenyl]anthracene and 4,4'-bis(2,2-diphenylethenyl)-1,1'-biphenyl (DPVBi) are useful hosts for blue emission.

Useful fluorescent emitting materials include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrylium and thiapyrylium compounds, fluorene derivatives, periflanthene derivatives, indenoperylene derivatives, bis(azinyl)amine boron compounds, bis(azinyl)methane compounds, and carbostyryl compounds. Illustrative examples of useful materials include, but are not limited to, the following:

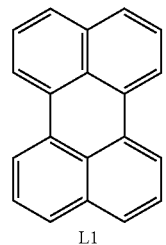

L1

-continued
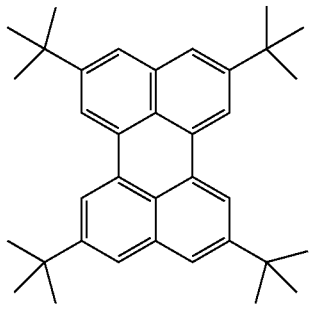
L2
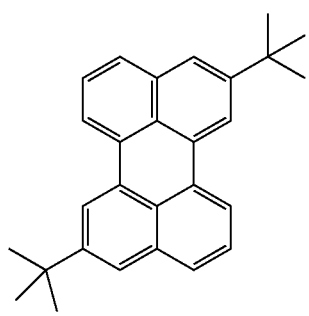
L3
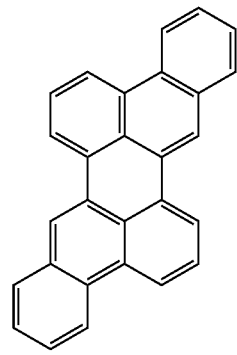
L4
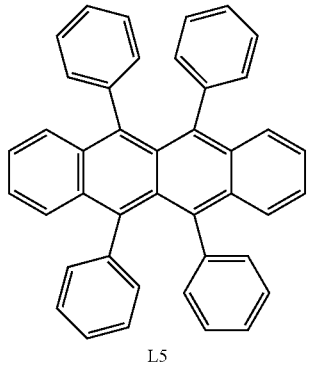
L5
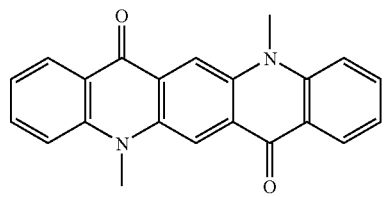
-continued
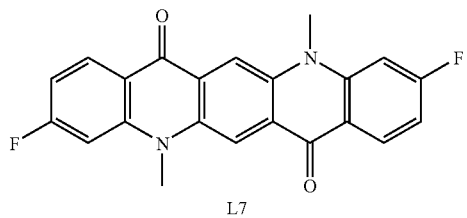
L6
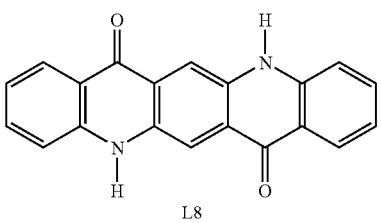
L7
L8
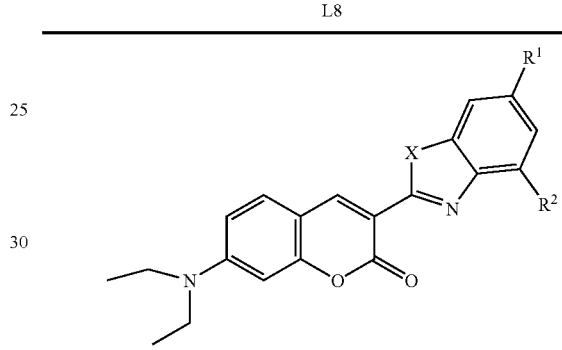
| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |
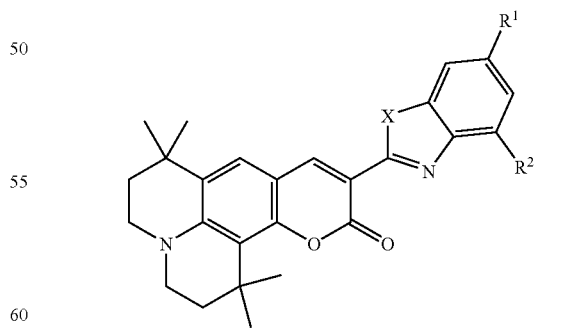
| | X | R1 | R2 |
|---|---|---|---|
| L23 | O | H | H |
| L24 | O | H | Methyl |
| L25 | O | Methyl | H |
| L26 | O | Methyl | Methyl |

-continued
| | | | |
|---|---|---|---|
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |
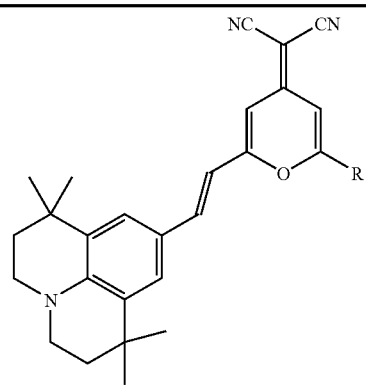
| | R |
|---|---|
| L37 | phenyl |
| L38 | methyl |
| L39 | t-butyl |
| L40 | mesityl |
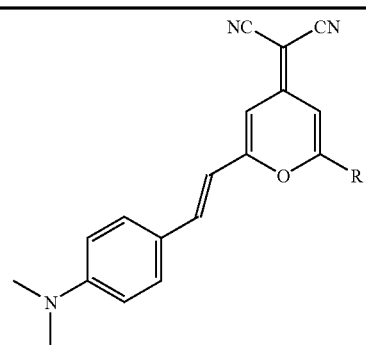
| | R |
|---|---|
| L41 | phenyl |
| L42 | methyl |
| L43 | t-butyl |
| L44 | mesityl |
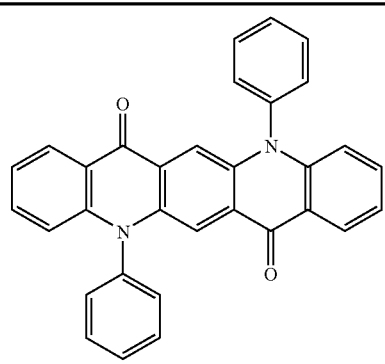
L45
-continued
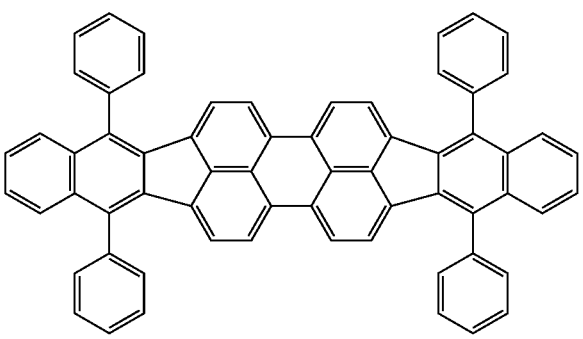
L46
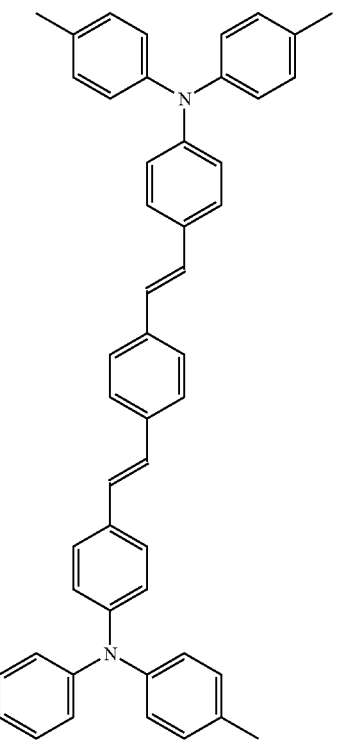
L47

-continued

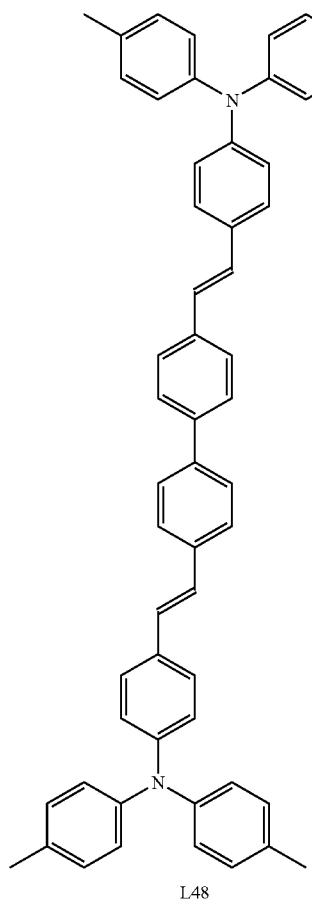
L48

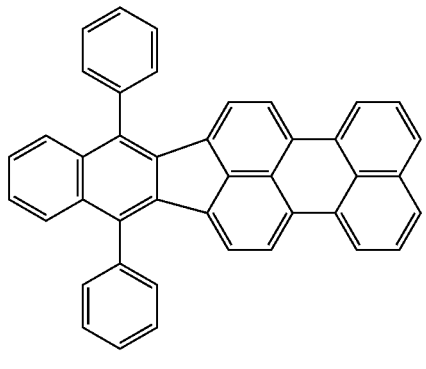
L49

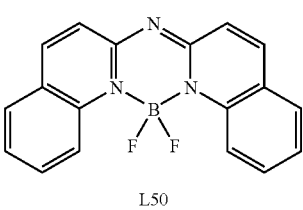
L50

-continued

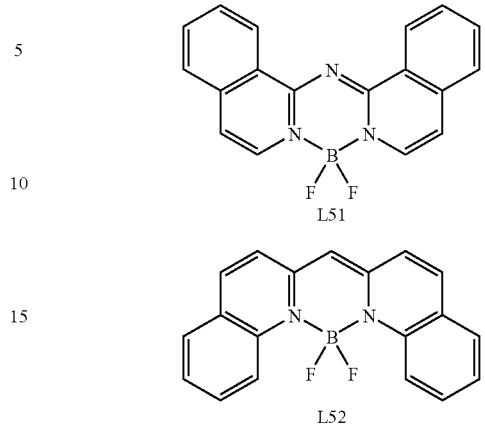
L51

L52

Hole Blocking Layer (HBL)

In addition to suitable hosts and transporting materials, an OLED device according to the invention may also include at least one hole blocking layer 110 placed between the electron transporting layer 111 and the light emitting layer 109 to help confine the excitons and recombination events to the light emitting layer comprising co-hosts and a phosphorescent emitter. In this case, there should be an energy barrier for hole migration from co-hosts into the hole blocking layer, while electrons should pass readily from the hole blocking layer into the light emitting layer comprising co-host materials and a phosphorescent emitter. The first requirement entails that the ionization potential of the hole blocking layer 110 be larger than that of the light emitting layer 109, desirably by 0.2 eV or more. The second requirement entails that the electron affinity of the hole blocking layer 110 not greatly exceed that of the light emitting layer 109, and desirably be either less than that of light emitting layer or not exceed that of the light emitting layer by more than about 0.2 eV.

When used with an electron transporting layer whose characteristic luminescence is green, such as an Alq-containing electron transporting layer as described below, the requirements concerning the energies of the highest occupied molecular orbital (HOMO) and lowest unoccupied molecular orbital (LUMO) of the material of the hole blocking layer frequently result in a characteristic luminescence of the hole blocking layer at shorter wavelengths than that of the electron transporting layer, such as blue, violet, or ultraviolet luminescence. Thus, it is desirable that the characteristic luminescence of the material of a hole blocking layer be blue, violet, or ultraviolet. It is further desirable that the triplet energy of the hole blocking material be greater than that of the phosphorescent material. Suitable hole blocking materials are described in WO 00/70655A2, WO 01/41512 and WO 01/93642 A1. Two examples of useful hole blocking materials are bathocuproine (BCP) and bis(2-methyl-8-quinolinolato)(4-phenylphenolato)aluminum(III) (BAlq). The characteristic luminescence of BCP is in the ultraviolet, and that of BAlq is blue. Metal complexes other than BAlq are also known to block holes and excitons as described in US 20030068528. In addition, US 20030175553 A1 describes the use of fac-tris(1-phenylpyrazolato-N,$C^{2'}$)iridium(III) (Ir-ppz) for this purpose.

When a hole blocking layer is used, its thickness can be between 2 and 100 nm and suitably between 5 and 10 nm.

Electron Transporting Layer (ETL)

Similarly, it is usually advantageous to have an electron transporting layer deposited between the cathode and the emissive layer. The electron transporting material deposited in said electron transporting layer between the cathode and the light emitting layer may be the same or different from an electron transporting co-host material. The electron transporting layer may include more than one electron transporting compound, deposited as a blend or divided into separate layers.

Preferred thin film-forming materials for use in constructing the electron transporting layer of the organic EL devices of this invention are metal-chelated oxinoid compounds, including chelates of oxine itself (also commonly referred to as 8-quinolinol or 8-hydroxyquinoline). Such compounds help to inject and transport electrons, exhibiting high levels of performance, and are readily fabricated in the form of thin films. Exemplary of contemplated oxinoid compounds are those satisfying structural formula (37) below:

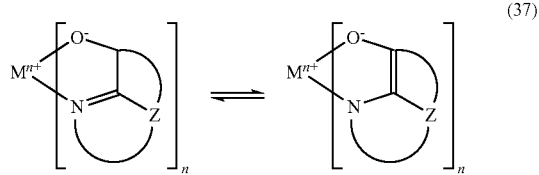

(37)

wherein
M represents a metal;
n is an integer of from 1 to 4; and
Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:
CO-1: Aluminum trisoxine [alias, tris(8-quinolinolato)aluminum(III)];
CO-2: Magnesium bisoxine [alias, bis(8-quinolinolato)magnesium(II)];
CO-3: Bis[benzo{f}-8-quinolinolato]zinc (II);
CO-4: Bis(2-methyl-8-quinolinolato)aluminum(III)-μ-oxo-bis(2-methyl-8-quinolinolato)aluminum(III);
CO-5: Indium trisoxine [alias, tris(8-quinolinolato)indium];
CO-6: Aluminum tris(5-methyloxine) [alias, tris(5-methyl-8-quinolinolato)aluminum(III)];
CO-7: Lithium oxine [alias, (8-quinolinolato)lithium(I)];
CO-8: Gallium oxine [alias, tris(8-quinolinolato)gallium (III)];
CO-9: Zirconium oxine [alias, tetra(8-quinolinolato)zirconium(IV)].

Other electron transporting materials suitable for use in the electron transporting layer are the aluminum complexes described by formula (30) above, which are also the compounds employed as electron transporting co-hosts in the present invention.

Other electron transporting materials suitable for use in the electron transporting layer include various butadiene derivatives as disclosed in U.S. Pat. No. 4,356,429 and various heterocyclic optical brighteners as described in U.S. Pat. No. 4,539,507. Benzazoles satisfying structural formula (36) are also useful electron transporting materials:

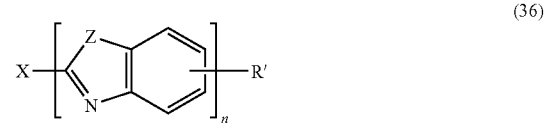

(36)

wherein
n is an integer of 3 to 8;
Z is O, NR or S; and
R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and
X is a linkage unit consisting of carbon, alkyl, aryl, substituted alkyl, or substituted aryl, which conjugately or unconjugately connects the multiple benzazoles together. An example of a useful benzazole is 2,2',2"-(1,3,5-phenylene)tris [1-phenyl-1H-benzimidazole] (TPBI) (see formula (11)) disclosed in Shi et al. in U.S. Pat. No. 5,766,779.

Other electron transporting materials suitable for use in the electron transporting layer may be selected from triazines, triazoles, imidazoles, oxazoles, thiazoles and their derivatives, polybenzobisazoles, pyridine- and quinoline-based materials, cyano-containing polymers and perfluorinated materials.

The electron transporting layer or a portion of the electron transporting layer adjacent the cathode may further be doped with an alkali metal to reduce electron injection barriers and hence lower the drive voltage of the device. Suitable alkali metals for this purpose include lithium and cesium.

If both a hole blocking and an electron transporting layers are used in OLED device, electrons should pass readily from the electron transporting layer into the hole blocking layer. Therefore, the electron affinity of the electron transporting layer should not greatly exceed that of the hole blocking layer. Preferably, the electron affinity of the electron transporting layer should be less than that of the hole blocking layer or not exceed it by more than about 0.2 eV.

If an electron transporting layer is used, its thickness may be between 2 and 100 nm and preferably between 5 and 50 nm.

Other Useful Organic Layers and Device Architecture

In some instances, layers 109 through 111 can optionally be collapsed into a single layer that serves the function of supporting both light emission and electron transportation. Layers 110 and 111 may also be collapsed into a single layer that functions to block holes or excitons, and supports electron transport. It also known in the art that emitting materials may be included in the hole transporting layer 107. In that case, the hole transporting material may serve as a host. Multiple materials may be added to one or more layers in order to create a white emitting OLED, for example, by combining blue- and yellow emitting materials, cyan- and red emitting materials, or red-, green-, and blue emitting materials. White emitting devices are described, for example, in EP 1 187 235, US 20020025419, EP 1 182 244, U.S. Pat. Nos. 5,683,823, 5,503,910, 5,405,709, and 5,283,182 and can be equipped with a suitable filter arrangement to produce a color emission.

This invention may be used in so-called stacked device architecture, for example, as taught in U.S. Pat. Nos. 5,703,436 and 6,337,492.

Deposition of Organic Layers

The organic materials mentioned above are suitably deposited by any means suitable for the form of the organic materials. In the case of small molecules, they are conveniently deposited through sublimation or evaporation, but can be deposited by other means such as coating from a solvent together with an optional binder to improve film formation. If the material is a polymer, solvent deposition is usually preferred. The material to be deposited by sublimation or evaporation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551, 5,851,709 and 6,066,357) or an inkjet method (U.S. Pat. No. 6,066,357).

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as $SiO_x$, Teflon, and alternating inorganic/polymeric layers are known in the art for encapsulation. Any of these methods of sealing or encapsulation and desiccation can be used with the EL devices constructed according to the present invention.

Optical Optimization

OLED devices of this invention can employ various well-known optical effects in order to enhance their emissive properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color-conversion filters over the display. Filters, polarizers, and anti-glare or anti-reflection coatings may be specifically provided over the EL device or as part of the EL device.

Embodiments of the invention can provide advantageous features such as higher luminous yield, low drive voltage, and higher power efficiency. Embodiments of the organometallic compounds useful in the invention can provide a wide range of hues including those useful in the emission of white light (directly or through filters to provide multicolor displays). Embodiments of the invention can also provide an area lighting device.

The invention and its advantages can be better appreciated by the following examples.

DEVICE EXAMPLES 1-4

An EL device (Device 1) satisfying the requirements of the invention was constructed in the following manner:

1. A glass substrate, coated with an approximately 85 nm layer of indium-tin oxide (ITO) as the anode, was sequentially ultrasonicated in a commercial detergent, rinsed in deionized water, degreased in toluene vapor and exposed to oxygen plasma for about 1 minute.
2. Over the ITO was deposited a 1 nm fluorocarbon ($CF_x$) hole injecting layer (HIL) by plasma-assisted deposition of $CHF_3$.
3. A hole transporting layer (HTL) of N,N'-di-1-naphthyl-N,N'-diphenyl-4,4'-diaminobiphenyl (NPB) having a thickness of 37.5 nm was then evaporated from a resistively heated tantalum boat.
4. An exciton blocking layer (EBL) of 4,4',4"-tris(carbazolyl)-triphenylamine (TCTA) having a thickness of 37.5 nm was then evaporated from a resistively heated tantalum boat.
5. A 35 nm light emitting layer (LEL) consisting of a mixture of 2,2',2"-(1,3,5-phenylene)tris[1-phenyl-1H-benzimidazole] (TPBI) as the electron transporting co-host, TCTA as the hole transporting co-host present at a concentration of 30 wt. % of the total of the co-host materials in the LEL, and fac tris(2-phenyl-pyridinato-$N,C^{2'}$)Iridium (III) [i.e., Ir(ppy)$_3$] as a phosphorescent emitter at a concentration of 6 wt. % relative to the total of the co-host materials was then deposited onto the exciton blocking layer. These materials were also evaporated from tantalum boats.
6. A hole blocking layer (HBL) of 2,2',2"-(1,3,5-phenylene)tris[1-phenyl-1H-benzimidazole] (TPBI) having a thickness of 10 nm was then evaporated from another tantalum boat.
7. A 40 nm electron transporting layer (ETL) of tris(8-quinolinolato)aluminum (III) (Alq) was then deposited onto the light emitting layer. This material was also evaporated from a tantalum boat.
8. On top of the Alq layer was deposited a 220 nm cathode formed of a 10:1 volume ratio of Mg and Ag.

The above sequence completed the deposition of the EL device. Therefore, Device 1 has the following structure of layers: ITO|$CF_x$ (1 nm)|NBP (37.5 nm)|TCTA (37.5 nm)|(TPBI+30 wt. % TCTA)+6 wt. % Ir(ppy)$_3$ (35 nm)|TPBI (10 nm)|Alq (40 nm)|Mg:Ag (220 nm). The device, together with a desiccant, was then hermetically packaged in a dry glove box for protection against ambient environment.

A comparative EL device (Device 2) not satisfying the requirements of the invention was fabricated in an identical manner to Device 1 except for using NPB in place of TCTA in the exciton blocking layer. As a result, Device 2 has a 75 nm thick HTL consisting entirely of NPB. Device 2 has the following structure of layers: ITO|$CF_x$ (1 nm)|NBP (75 nm)|(TPBI+30 wt. % TCTA)+6 wt. % Ir(ppy)$_3$ (35 nm)|TPBI (10 nm)|Alq (40 nm)|Mg:Ag (220 nm). This example illustrates the importance to the present invention of selecting a high triplet energy (>2.5 eV) material for the exciton blocking layer.

An EL device (Device 3) satisfying the requirements of the invention was fabricated in an identical manner to Device 1 except that bis(2-methyl-quinolinolato)(4-phenylphenolato) aluminum(III) (BAlq) is used in place TPBI in the hole blocking layer (HBL). Device 3 has the following structure of layers: ITO|CF$_x$ (1 nm)|NBP (37.5 nm)|TCTA (37.5 nm)| (TPBI+30 wt. % TCTA)+6 wt. % Ir(ppy)$_3$ (35 nm)|BAlq (10 nm)|Alq (40 nm)|Mg:Ag (220 nm). This example further illustrates the importance of selecting the material for the hole blocking layer based in its triplet energy relative to that of the desired phosphorescent dopant.

A comparative EL device (Device 4) not satisfying the requirements of the invention was fabricated in an identical manner to Device 1 except TCTA was not included in the LEL and TPBI was used as a neat host for Ir(ppy)$_3$. Device 4 has the following structure of layers: ITO|CF$_x$ (1 nm)|NBP (37.5 nm)|TCTA (37.5 nm)|TPBI+6 wt. % Ir(ppy)$_3$ (35 nm)|TPBI (10 nm)|Alq (40 nm)|Mg:Ag (220 nm).

The cells thus formed were tested for efficiency and color at an operating current density of 1 mA/cm$^2$ and the results are reported in Table 1 in the form of luminance yield and CIE (Commission Internationale de l'Eclairage) coordinates.

TABLE 1

Evaluation Results for EL devices.

| Device | Luminous yield (cd/A) | Voltage (V) | CIEx | CIEy | Type |
|---|---|---|---|---|---|
| 1 | 51.9 | 7.6 | 0.30 | 0.63 | Invention |
| 2 | 30.9 | 5.9 | 0.30 | 0.63 | Comparison |
| 3 | 47.8 | 8.0 | 0.30 | 0.63 | Invention |
| 4 | 37.9 | 8.8 | 0.31 | 0.62 | Comparison |

As can be seen from Table 1, EL device 1 incorporating TPBI and TCTA materials as co-hosts in the LEL and exciton blocking layers on each side of the LEL, according to the present invention, demonstrated higher luminous yield than the comparative devices with same co-hosts and an exciton blocking layer on just one side of the LEL. The presence of a layer of high triplet energy material between the hole transporting and emissive layer is extremely important for effective confinement of the triplet excitons within the LEL and prevention of possible exciton diffusion into the HTL. Without EBL, the loss of triplet excitons into the HTL will amount to a significant quenching of the electroluminescence. Suitable materials for the EBL layer should be selected so that their triplet energy levels lie higher than that of the phosphorescent dopant (see description of the invention). The triplet energy of TCTA is calculated to be about 2.85 eV, which is higher than triplet energy of Ir(ppy)$_3$ (about 2.5 eV). TCTA is also known to transport holes; hence, TCTA satisfies the requirements for the EBL material.

Triplet exciton diffusion into an ETL should also be considered. Device 3 includes, in addition to EBL adjacent to the LEL on the anode side, a hole blocking layer of BAlq between LEL and electron transporting layer; however, the triplet energy of BAlq is calculated to be 2.37 eV which is lower than the triplet energy of the phosphorescent emitter used. The luminous efficiency of Device 3 is lower than that of inventive Device 1. This example shows that device performance can be even further improved by incorporation of a blocking layer on the cathode side that has higher triplet energy than the emitter.

Inventive Device 1 also provides higher luminous yield and lower drive voltage compared to Device 4 where the host for Ir(ppy)$_3$ is neat TPBI.

DEVICE EXAMPLES 5-6

An EL device (Device 5) satisfying the requirements of the invention was fabricated in an identical manner to Device 1 except that about 1 wt. % of lithium was co-deposited with the electron transporting Alq material.

An EL device (Device 6) also satisfying the requirements of the invention was fabricated in an identical manner to Device 5 except that the Alq layer did not contain lithium.

The devices were operated at a constant current density of 1 mA/cm$^2$, and voltage and luminance properties were measured. The results are shown in Table 2.

TABLE 2

Evaluation Results for EL devices 5 and 6.

| Device | Luminous yield (cd/A) | Voltage (V) | CIEx | CIEy | Type |
|---|---|---|---|---|---|
| 5 | 51.6 | 6.4 | 0.34 | 0.30 | Invention |
| 6 | 50.0 | 9.2 | 0.33 | 0.30 | Invention |

The results in Table 2 comparing Devices 5 and 6 show that in the practice of the invention, the incorporation of the alkali metal dopant lithium into the electron transporting layer further decreases the drive voltage.

DEVICE EXAMPLES 7-8

A EL device (Device 7) satisfying the requirements of the invention was fabricated in an identical manner to Device 1 except that an NPB layer was not deposited, and a 75 nm exciton blocking layer of 1,1-Bis(4-(N,N-di-p-tolylamino) phenyl)cyclohexane (TAPC) was deposited in place of the 37.5 nm layer of TCTA. TAPC is also used in place of TCTA in the LEL at a concentration of 20 wt. % of the total of the co-hosts. Therefore, Device 7 has the following structure of layers: ITO|CF$_x$ (1 nm)|TAPC (75 nm)|(TPBI+20 wt. % TAPC)+6 wt. % Ir(ppy)$_3$ (35 nm)|TPBI (10 nm)|Alq (40 nm)|Mg:Ag (220 nm).

A comparative EL device (Device 8) not satisfying the requirements of the invention was fabricated in an identical manner to Device 7 except TAPC was not included in the LEL and TPBI was used as a neat host for Ir(ppy)$_3$.

These devices were operated at a constant current density of 1 mA/cm$^2$, and voltage and luminance properties were measured. The results are shown in Table 3.

TABLE 3

Evaluation Results for EL devices 7 and 8.

| Device | Luminous yield (cd/A) | Voltage (V) | CIEx | CIEy | Type |
|---|---|---|---|---|---|
| 7 | 53.8 | 5.9 | 0.30 | 0.62 | Invention |
| 8 | 33.1 | 7.07 | 0.32 | 0.62 | Comparison |

Device 7, utilizing Ir(ppy)$_3$ as a green phosphorescent dopant and the co-host materials in the light emitting layer and further including exciton blocking layers, provides higher luminous yield and lower drive voltage compared to Device 8 where the host for the phosphorescent dopant is neat TPBI.

DEVICE EXAMPLE 9-10

A EL device (Device 9) satisfying the requirements of the invention was fabricated in an identical manner to Device 1 except that the 4,4',4''-tris[(3-methylphenyl)phenylamino]triphenylamine (MTDATA) was used in place of TCTA in the LEL. Device 9 has the following structure of layers: ITO|CF$_x$ (1 nm)|NBP (37.5 nm)|TCTA (37.5 nm)|(TPBI+30 wt. % MTDATA)+6 wt. % Ir(ppy)$_3$ (35 nm)|TPBI (10 nm)|Alq (40 nm)|Mg:Ag (220 nm).

A comparative EL device (Device 10) not satisfying the requirements of the invention was fabricated in an identical manner to Device 9 except MTDATA was not included in the LEL and TPBI was used as a neat host for Ir(ppy)$_3$.

These devices were operated at a constant current density of 1 mA/cm$^2$ and voltage and luminance properties were measured. The results are shown in Table 4.

TABLE 4

Evaluation Results for EL devices 9 and 10.

| Device | Luminous yield (cd/A) | Voltage (V) | CIEx | CIEy | Type |
|---|---|---|---|---|---|
| 9 | 39.4 | 8.3 | 0.31 | 0.62 | Invention |
| 10 | 35.6 | 9.4 | 0.32 | 0.62 | Comparison |

DEVICE EXAMPLES 11-12

An EL device (Device 11) satisfying the requirements of the invention was fabricated in an identical manner to Device 1 except that 2,9-dimethyl-4,7-diphenyl-1,10-phenanthroline (BCP) was used in place of TPBI in the LEL and in the hole blocking layer. The hole transporting material of the co-host consisted of TCTA at a concentration of 50 wt. %. Device 11 has the following structure of layers: ITO|CF$_x$ (1 nm)|NBP (37.5 nm)|TCTA (37.5 nm)|(BCP+50 wt. % TCTA)+6 wt. % Ir(ppy)$_3$ (35 nm)|BCP(10 nm)|Alq (40 nm)|Mg:Ag (220 nm).

A comparative EL device (Device 12) not satisfying the requirements of the invention was fabricated in an identical manner to Device 11 except TCTA was not included in the LEL and BCP was used as a neat host for Ir(ppy)$_3$.

These devices were operated at a constant current density of 1 mA/cm$^2$ and voltage and luminance properties were measured. The results are shown in Table 5.

TABLE 5

Evaluation Results for EL devices 11 and 12.

| Device | Luminous yield (cd/A) | Voltage (V) | CIEx | CIEy | Type |
|---|---|---|---|---|---|
| 11 | 38.6 | 7.0 | 0.30 | 0.63 | Invention |
| 12 | 25.4 | 8.9 | 0.31 | 0.62 | Comparison |

Again, Device 11, utilizing Ir(ppy)$_3$ as a green phosphorescent dopant and the co-host materials in the light emitting layer and further including exciton blocking layers, provides higher luminous yield and lower drive voltage compared to Device 12 where the host for the phosphorescent dopant is neat BCP.

DEVICE EXAMPLES 13-14

A EL device (Device 13) satisfying the requirements of the invention was fabricated in an identical manner to Device 1 except that the [1,1'-biphenyl]-4,4'-diyl)bis[bis(2,4,6-trimethylphenyl)-borane (BMDBB) was used in place of TPBI in the LEL and in the hole blocking layer. The hole transporting material of the co-host consisted of TCTA at a concentration of 20 wt. % of the total of the co-host materials in the LEL. Device 13 has the following structure of layers: ITO|CF$_x$ (1 nm)|NBP (37.5 nm)|TCTA (37.5 nm)|(BMDBB+20 wt. % TCTA)+6 wt. % Ir(ppy)$_3$ (35 nm)|BMDBB (10 nm)|Alq (40 nm)|Mg:Ag (220 nm).

A comparative EL device (Device 14) not satisfying the requirements of the invention was fabricated in an identical manner to Device 13 except TCTA was not included in the LEL and BMDBB was used as a neat host for Ir(ppy)$_3$.

Devices were operated at a constant current density of 1 mA/cm$^2$ and voltage and luminance properties were measured. The results are shown in Table 6.

TABLE 6

Evaluation Results for EL devices 13 and 14.

| Device | Luminous yield (cd/A) | Voltage (V) | CIEx | CIEy | Type |
|---|---|---|---|---|---|
| 13 | 48.2 | 11.0 | 0.30 | 0.62 | Invention |
| 14 | 37.4 | 12.9 | 0.32 | 0.62 | Comparison |

Inventive Device 13, utilizing Ir(ppy)$_3$ as a green phosphorescent dopant and the co-host materials in the light emitting layer and further including exciton blocking layers, provides higher luminous yield and lower drive voltage compared to Device 14 where the host for the phosphorescent dopant is neat BMDBB.

DEVICE EXAMPLES 15-16

These devices employ the fac tris(2-(4',6'-difluorophenyl)pyridinato-N,C$^{2'}$)Iridium (III) [i.e., Ir(F$_2$ppy)$_3$] as a blue phosphorescent emitter.

An EL device (Device 15) satisfying the requirements of the invention was constructed in the following manner:
1. A glass substrate, coated with an approximately 85 nm layer of indium-tin oxide (ITO) as the anode, was sequentially ultrasonicated in a commercial detergent, rinsed in deionized water, degreased in toluene vapor and exposed to oxygen plasma for about 1 minute.
2. Over the ITO was deposited a 1 nm fluorocarbon (CF$_x$) hole injecting layer (HIL) by plasma-assisted deposition of CHF$_3$.
3. A hole transporting layer (HTL) of N,N'-di-1-naphthyl-N,N'-diphenyl-4,4'-diaminobiphenyl (NPB) having a thickness of 75 nm was then evaporated from a resistively heated tantalum boat.
4. An exciton blocking layer (EBL) of 4,4',4''-tris(carbazolyl)-triphenylamine (TCTA) having a thickness of 10 nm was then evaporated from a resistively heated tantalum boat.
5. A 35 nm light emitting layer (LEL) consisting of mixture of 2,2',2''-(1,3,5-phenylene)tris[1-phenyl-1H-benzimidazole] (TPBI) as the electron transporting co-host, TCTA as the hole transporting co-host present at a concentration of 30 wt. % of the total of the co-host materials in the LEL, and Ir(F$_2$ppy)$_3$ as a phosphorescent emitter at a concentration of 8 wt. % relative to the total of the co-host components was then deposited onto the exciton blocking layer. These materials were also evaporated from tantalum boats.

6. A hole blocking layer (HBL) of 2,2',2"-(1,3,5-phenylene)tris[1-phenyl-1H-benzimidazole] (TPBI) having a thickness of 10 nm was then evaporated from another tantalum boat.
7. A 20 nm electron transporting layer (ETL) of tris(8-quinolinolato)aluminum (III) (Alq) was then deposited onto the light emitting layer. This material was also evaporated from a tantalum boat.
8. On top of the Alq layer was deposited a 220 nm cathode formed of a 10:1 volume ratio of Mg and Ag.

The above sequence completed the deposition of the EL device. Therefore, Device 15 has the following structure of layers: ITO|$CF_x$ (1 nm)|NBP (75 nm)|TCTA (10 nm)|(TPBI+30 wt. % TCTA)+8 wt. % $Ir(F_2ppy)_3$ (35 nm)|TPBI (10 nm)|Alq (20 nm)|Mg:Ag (220 nm). The device, together with a desiccant, was then hermetically packaged in a dry glove box for protection against ambient environment.

A comparative EL device (Device 16) not satisfying the requirements of the invention was fabricated in an identical manner to Device 15 except for using NPB in place of TCTA in the exciton blocking layer. As a result, Device 16 has a 85 nm thick HTL consisting entirely of NPB. Device 16 has the following structure of layers: ITO|$CF_x$ (1 nm)|NBP (85 nm)|(TPBI+30 wt. % TCTA)+8 wt. % $Ir(ppy)_3$ (35 nm)|TPBI (10 nm)|Alq (20 nm)|Mg:Ag (220 nm). This example illustrates the importance to the present invention of selecting a high triplet energy (>2.5 eV) material for the exciton blocking layer adjacent the light emitting layer on the anode side.

These devices were operated at a constant current density of 1 $mA/cm^2$ and voltage and luminance properties were measured. The results are shown in Table 7.

TABLE 7

Evaluation Results for EL devices 15 and 16.

| Device | Luminous yield (cd/A) | Voltage (V) | CIEx | CIEy | Type |
|---|---|---|---|---|---|
| 15 | 14.4 | 5.0 | 0.16 | 0.35 | Invention |
| 16 | 7.7 | 5.1 | 0.16 | 0.34 | Comparison |

The Device 15, utilizing $Ir(F_2ppy)_3$ as a blue phosphorescent emitter in the co-hosts and further including exciton blocking layers, showed significant increase of luminous yield relative to comparative Device 16 without an exciton blocking layer adjacent the light emitting layer on the anode side.

DEVICE EXAMPLES 17-18

An EL device (Device 17) satisfying the requirements of the invention was fabricated in an identical manner to Device 15 except that about 6 wt. % of $Ir(F_2ppy)_3$ was co-deposited in the light emitting layer. Device 17 has the following structure of layers: ITO|$CF_x$ (1 nm)|NBP (75 nm)|TCTA (10 nm)|(TPBI+30 wt. % TCTA)+6 wt. % $Ir(F_2ppy)_3$ (35 nm)|TPBI (10 nm)|Alq (20 nm)|Mg:Ag (220 nm).

A comparative EL device (Device 18) not satisfying the requirements of the invention was fabricated in an identical manner to Device 17 except TCTA was not included in the LEL and TPBI was used as a neat host for the blue phosphorescent emitter.

These devices were operated at a constant current density of 1 $mA/cm^2$ and voltage and luminance properties were measured. The results are shown in Table 8.

TABLE 8

Evaluation Results for EL devices 17 and 18.

| Device | Luminous yield (cd/A) | Voltage (V) | CIEx | CIEy | Type |
|---|---|---|---|---|---|
| 17 | 12.5 | 5.2 | 0.16 | 0.36 | Invention |
| 18 | 3.8 | 7.2 | 0.17 | 0.38 | Comparison |

The Device 17, utilizing $Ir(F_2ppy)_3$ as a blue phosphorescent emitter in the co-hosts and further including exciton blocking layers, showed significant increase of luminous efficiency and a decrease in operational voltage relative to comparative Device 18 where the phosphorescent emitter was doped into a neat host.

DEVICE EXAMPLES 19-20

An EL device (Device 19) satisfying the requirements of the invention was constructed in the following manner:

1. A glass substrate, coated with an approximately 85 nm layer of indium-tin oxide (ITO) as the anode, was sequentially ultrasonicated in a commercial detergent, rinsed in deionized water, degreased in toluene vapor and exposed to oxygen plasma for about 1 minute.
2. Over the ITO was deposited a 1 nm fluorocarbon ($CF_x$) hole injecting layer (HIL) by plasma-assisted deposition of $CHF_3$.
3. A hole transporting layer (HTL) of N,N'-di-1-naphthyl-N,N'-diphenyl-4,4'-diaminobiphenyl (NPB) having a thickness of 65 nm was then evaporated from a resistively heated tantalum boat.
4. An exciton blocking layer (EBL) of 4,4',4"-tris(carbazolyl)-triphenylamine (TCTA) having a thickness of 10 nm was then evaporated from a resistively heated tantalum boat.
5. A 35 nm light emitting layer (LEL) consisting of a mixture of 2,2',2"-(1,3,5-phenylene)tris[1-phenyl-1H-benzimidazole] (TPBI) as the electron transporting co-host, TCTA as the hole transporting co-host present at a concentration of 30 wt. % of the total of the co-host materials in the LEL, and Compound Y as a phosphorescent emitter at a concentration of 4 wt. % relative to the total of the co-host materials was then deposited onto the exciton blocking layer. These materials were also evaporated from tantalum boats.
6. A hole blocking layer (HBL) of 2,2',2"-(1,3,5-phenylene)tris[1-phenyl-1H-benzimidazole] (TPBI) having a thickness of 10 nm was then evaporated from another tantalum boat.
7. A 40 nm electron transporting layer (ETL) of tris(8-quinolinolato)aluminum (III) (Alq) was then deposited onto the light emitting layer. This material was also evaporated from a tantalum boat.
8. On top of the Alq layer was deposited a 220 nm cathode formed of a 10:1 volume ratio of Mg and Ag.

The above sequence completed the deposition of the EL device. Therefore, Device 19 has the following structure of layers: ITO|$CF_x$ (1 nm)|NBP (65 nm)|TCTA (10 nm)|(TPBI+30 wt. % TCTA)+4 wt. % Compound Y (35 nm)|TPBI (10 nm)|Alq (40 nm)|Mg:Ag (220 nm). The device, together with a desiccant, was then hermetically packaged in a dry glove box for protection against ambient environment.

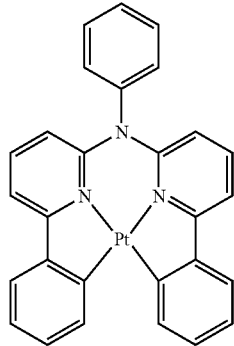

Compound Y

A comparative EL device (Device 20) not satisfying the requirements of the invention was fabricated in an identical manner to Device 19 except TCTA was not included in the LEL and TPBI was used as the neat host for Compound Y. As a result, Device 20 has the following structure of layers: ITO|CF$_x$ (1 nm)|NBP (65 nm)|TCTA(10 nm)|TPBI+4 wt. % Compound Y (35 nm)|TPBI (10 nm)|Alq (40 nm)|Mg:Ag (220 nm).

The cells thus formed were tested for efficiency and color at an operating current density of 1 mA/cm$^2$ and the results are reported in Table 9 in the form of luminance yield and CIE (Commission Internationale de l'Eclairage) coordinates.

TABLE 9

Evaluation Results for EL devices 19 and 20.

| Device | Luminous Yield (cd/A) | Voltage (V) | CIEx | CIEy | Type |
|---|---|---|---|---|---|
| 19 | 45.5 | 5.92 | 0.32 | 0.62 | Invention |
| 20 | 10.4 | 7.36 | 0.33 | 0.61 | Comparison |

As can be seen from Table 9, EL device 19 incorporating TPBI and TCTA materials as co-hosts according to the present invention provided higher luminous yield and lower drive voltage and compared to Device 20 where the host is neat TPBI.

DEVICE EXAMPLES 21-22

A EL device (Device 21) satisfying the requirements of the invention was fabricated in an identical manner to Device 19 except that 4,4',4"-tris[(3-methylphenyl)phenylamino]triphenylamine (MTDATA) was used in place of TCTA in the LEL. Device 21 has the following structure of layers: ITO|CF$_x$ (1 nm)|NBP (65 nm)|TCTA (10 nm)|(TPBI+30 wt. % MTDATA)+4 wt. % Compound Y (35 nm)|TPBI (10 nm)|Alq (40 nm)|Mg:Ag (220 nm).

A comparative EL device (Device 22) not satisfying the requirements of the invention was fabricated in an identical manner to Device 21 except MTDATA was not included in the LEL and TPBI was used as a neat host for Compound Y. Device 22 has the following structure of layers: ITO|CF$_x$ (1 nm)|NBP (65 nm)|TCTA (10 nm)|TPBI+4 wt. % Compound Y (35 nm)|TPBI (10 nm)|Alq (40 nm)|Mg:Ag (220 nm).

These devices were operated at a constant current density of 1 mA/cm$^2$ and voltage and luminance properties were measured. The results are shown in Table 10.

TABLE 10

Evaluation Results for EL devices 21 and 22.

| | Luminance Yield (cd/A) | Voltage (V) | CIEx | CIEy | Type |
|---|---|---|---|---|---|
| 21 | 41.1 | 6.47 | 0.34 | 0.61 | Invention |
| 22 | 10.2 | 7.38 | 0.34 | 0.61 | Comparison |

As can be seen from Table 10, EL Device 21 incorporating TPBI and TCTA materials as co-hosts according to the present invention provided higher luminous yield and lower drive voltage compared to Device 22 where the host is neat TPBI.

The entire contents of the patents and other publications referred to in this specification are incorporated herein by reference. The invention has been described in detail with particular reference to certain preferred embodiments thereof, but it will be understood that variations and modifications can be effected within the spirit and scope of the invention.

PARTS LIST

101 Substrate
103 Anode
105 Hole Injecting layer (HIL)
107 Hole Transporting layer (HTL)
108 Exciton blocking layer (EBL)
109 Light Emitting layer (LEL)
110 Hole Blocking layer (HBL)
111 Electron Transporting layer (ETL)
113 Cathode
150 Voltage/Current Source
160 Electrical Conductors

The invention claimed is:

1. An OLED device comprising a cathode, an anode, and located therebetween a light emitting layer (LEL) comprising: a phosphorescent compound of Ir or Pt represented by the formula:

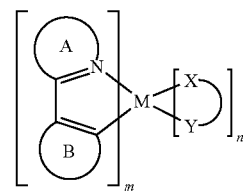

wherein:
A is a substituted or unsubstituted heterocyclic ring containing at least one N atom;
B is a substituted or unsubstituted aromatic or heteroaromatic ring or a ring containing a vinyl C bonded to M;
X-Y is an anionic bidentate ligand; and
either m is an integer from 1 to 3, and n in an integer from 0 to 2 such that m+n =3 for M=Ir or m is an integer from 1 to 2 and n in an integer from 0 to 1 such that m+n=2 for M=Pt;

with at least one hole transporting co-host and at least one electron transporting co-host wherein the hole transporting co-host is a substituted triarylamine with two or more triarylamine groups and no aromatic hydrocarbon fused-rings and is present at a concentration of 5 to 70 weight % of the total of the hole- and electron transporting co-host materials in the light emitting layer and wherein the triplet energy of each of the co-host materials is greater than the triplet energy of the phosphorescent emitter; and wherein the electron transporting co-host is represented by the formula:

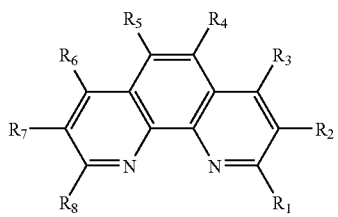

wherein:
R$_1$-R$_8$ are independently hydrogen, alkyl, aryl or substituted aryl, and at least one of R$_1$-R$_8$ is aryl or substituted aryl; and
an exciton blocking layer adjacent the emitting layer on the anode side comprising a hole transporting material with triplet energy greater or equal to 2.5 eV; and
a layer directly adjacent the light emitting layer on the cathode side comprising an electron transporting material with triplet energy greater than the phosphorescent emitter.

2. A device of claim 1 wherein the electron transporting co-host is selected from one of the formulae:

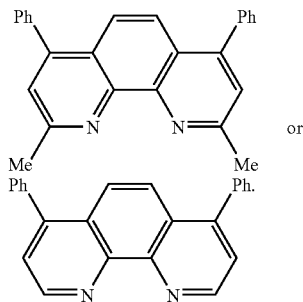

3. An OLED device comprising a cathode, an anode, and located therebetween a light emitting layer (LEL) comprising: a phosphorescent compound of Ir or Pt represented by the formula:

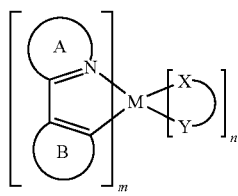

wherein;
A is a substituted or unsubstituted heterocyclic ring containing at least one N atom;
B is a substituted or unsubstituted aromatic or heteroaromatic ring or a ring containing a vinyl C bonded to M;
X-Y is an anionic bidentate ligand; and
either m is an integer from 1 to 3, and n in an integer from 0 to 2 such that m+n=3 for M=Ir or m is an integer from 1 to 2 and n in an integer from 0 to 1 such that m+n=2 for M=Pt;
with at least one hole transporting co-host and at least one electron transporting co-host wherein the hole transporting co-host is a substituted triarylamine with two or more triarylamine groups and no aromatic hydrocarbon fused-rings and is present at a concentration of 5 to 70 weight % of the total of the hole- and electron transporting co-host materials in the light emitting layer and wherein the triplet energy of each of the co-host materials is greater than the triplet energy of the phosphorescent emitter; and wherein the electron transporting co-host is represented by the formula:

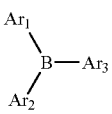

wherein:
Ar$_1$ to Ar$_3$ are independently an aromatic hydrocarbocyclic group or an aromatic heterocyclic group which may have a substituent; and
an exciton blocking layer adjacent the emitting layer on the anode side comprising a hole transporting material with triplet energy greater or equal to 2.5 eV; and
a layer directly adjacent the light emitting layer on the cathode side comprising an electron transporting material with triplet energy greater than the phosphorescent emitter.

4. A device of claim 3 wherein the electron transporting co-host is selected from the following formulae:

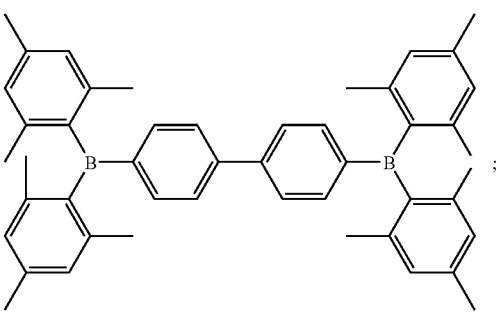

-continued

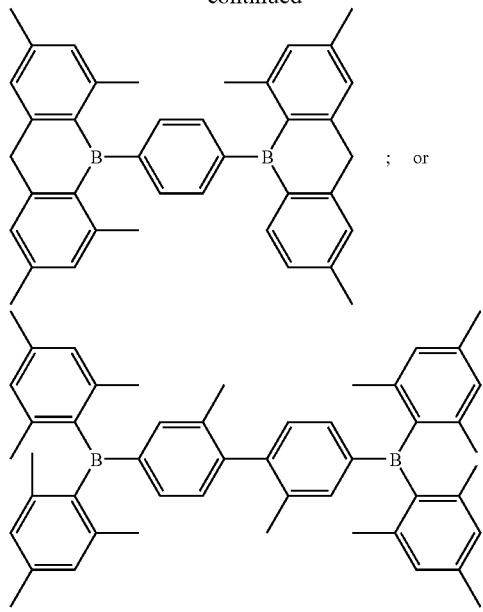
; or

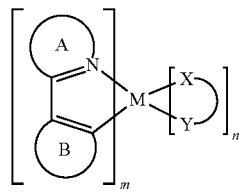
.

5. An OLED device comprising a cathode, an anode, and located therebetween a light emitting layer (LEL) comprising: a phosphorescent compound of Ir or Pt represented by the formula:

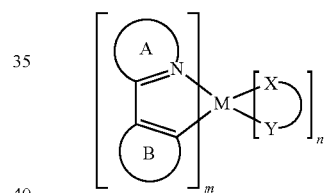

wherein:
A is a substituted or unsubstituted heterocyclic ring containing at least one N atom;
B is a substituted or unsubstituted aromatic or heteroaromatic ring or a ring containing a vinyl C bonded to M;
X-Y is an anionic bidentate ligand; and
either m is an integer from 1 to 3, and n in an integer from 0 to 2 such that m+n =3 for M=Ir or m is an integer from 1 to 2 and n in an integer from 0 to 1 such that m+n=2 for M=Pt;
with at least one hole transporting co-host and at least one electron transporting co-host wherein the hole transporting co-host is a substituted triarylamine with two or more triarylamine groups and no aromatic hydrocarbon fused-rings and is present at a concentration of 5 to 70 weight % of the total of the hole- and electron transporting co-host materials in the light emitting layer and wherein the triplet energy of each of the co-host materials is greater than the triplet energy of the phosphorescent emitter; and wherein the electron transporting co-host is a substituted 1,3, 4-oxadiazole; and
an exciton blocking layer adjacent the emitting layer on the anode side comprising a hole transporting material with triplet energy greater or equal to 2.5 eV; and
a layer directly adjacent the light emitting layer on the cathode side comprising an electron transporting material with triplet energy greater than the phosphorescent emitter.

6. A device of claim 5 wherein the electron transporting co-host is selected from one of the formulae:

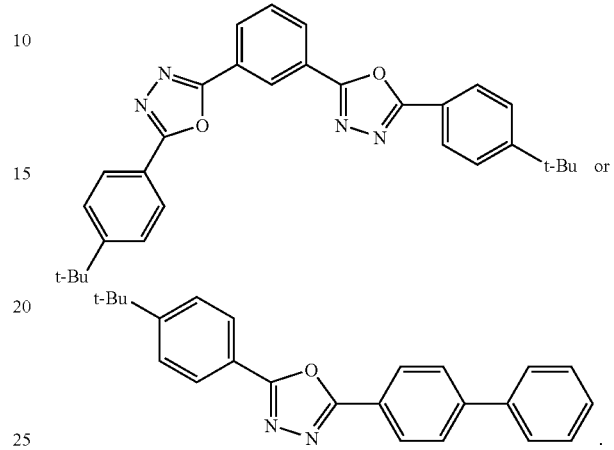

7. An OLED device comprising a cathode, an anode, and located therebetween a light emitting layer (LEL) comprising: a phosphorescent compound of Ir or Pt represented b the formula:

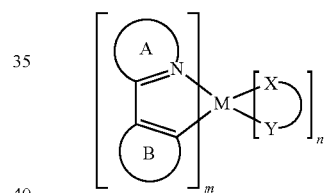

wherein:
A is a substituted or unsubstituted heterocyclic ring containing at least one N atom;
B is a substituted or unsubstituted aromatic or heteroaromatic ring or a ring containing a vinyl C bonded to M;
X-Y is an anionic bidentate ligand; and
either m is an integer from 1 to 3, and n in an integer from 0 to 2 such that m+n =3 for M=Ir or m is an integer from 1 to 2 and n in an integer from 0 to 1 such that m+n=2 for M=Pt;
with at least one hole transporting co-host and at least one electron transporting co-host wherein the hole transporting co-host is a substituted triarylamine with two or more triarylamine groups and no aromatic hydrocarbon fused-rings and is present at a concentration of 5 to 70 weight % of the total of the hole- and electron transporting co-host materials in the light emitting layer and wherein the triplet energy of each of the co-host materials is greater than the triplet energy of the phosphorescent emitter; and wherein the electron transporting co-host is a substituted 1,2, 4-oxadiazole; and
an exciton blocking layer adjacent the emitting layer on the anode side comprising a hole transporting material with triplet energy greater or equal to 2.5 eV; and a layer directly adjacent the light emitting layer on the cathode side comprising an electron transporting material with triplet energy greater than the phosphorescent emitter.

8. A device of claim 7 wherein the electron transporting co-host is a substituted or unsubstituted triazole having the formula:

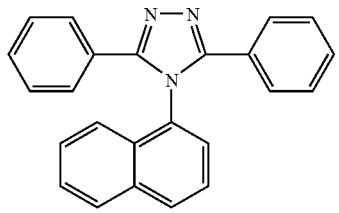

9. An OLED device comprising a cathode, an anode, and located therebetween a light emitting layer (LEL) comprising: a phosphorescent compound of Ir or Pt represented by the formula:

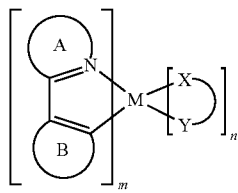

wherein:
A is a substituted or unsubstituted heterocyclic ring containing at least one N atom;
B is a substituted or unsubstituted aromatic or heteroaromatic ring or a ring containing a vinyl C bonded to M;
X-Y is an anionic bidentate ligand; and
either m is an integer from 1 to 3, and n in an integer from 0 to 2 such that m+n =3 for M=Ir or m is an integer from 1 to 2 and n in an integer from 0 to 1 such that m+n=2 for M=Pt;
  with at least one hole transporting co-host and at least one electron transporting co-host wherein the hole transporting co-host is a substituted triarylamine with two or more triarylamine groups and no aromatic hydrocarbon fused-rings and is present at a concentration of 5 to 70 weight % of the total of the hole- and electron transporting co-host materials in the light emitting layer and wherein the triplet energy of each of the co-host materials is greater than the triplet energy of the phosphorescent emitter; and wherein the electron transporting co-host is a substituted 1,3,5-oxadiazole; and
  an exciton blocking layer adjacent the emitting layer on the anode side comprising a hole transporting material with triplet energy greater or equal to 2.5 eV; and
  a layer directly adjacent the light emitting layer on the cathode side comprising an electron transporting material with triplet energy greater than the phosphorescent emitter.

10. A device of claim 9 wherein the electron transporting co-host is selected from the group consisting of:
2,4,6-tris(diphenylamino)-1,3,5-triazine;
2,4,6-tricarbazolo-1,3,5-triazine;
2,4,6-tris(N-phenyl-2-naphthylamino)-1,3,5-triazine;
2,4,6-tris(N-phenyl-1-naphthylamino)-1,3,5-triazine;
4,4', 6,6'-tetraphenyl-2,2'-bi-1,3,5-triazine; and
2,4,6-tris([1,1':3',1''-terphenyl]-5'-yl)-1,3,5-triazine.

11. An OLED device comprising a cathode, an anode, and located therebetween a light emitting layer (LEL) comprising a phosphorescent compound of Ir or Pt represented by the formula:

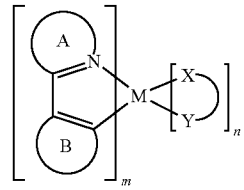

wherein:
A is a substituted or unsubstituted heterocyclic ring containing at least one N atom;
B is a phenyl ring additionally substituted with one or two F atoms, one or two $CF_3$ groups, or one F atom and one $CF_3$ group or ring B is a phenyl ring additionally substituted with substituted or unsubstituted phenyl or napthyl group para to the M-C bond;
X-Y is an anionic bidentate ligand; and
either m is an integer from 1 to 3, and n in an integer from 0 to 2 such that m+n =3 for M=Ir or m is an integer from 1 to 2 and n in an integer from 0 to 1 such that m+n=2 for M=Pt;
  with at least one hole transporting co-host and at least one electron transporting co-host wherein the hole transporting co-host is a substituted triarylamine with two or more triarylamine groups and no aromatic hydrocarbon fused-rings and is present at a concentration of 5 to 70 weight % of the total of the hole- and electron transporting co-host materials in the light emitting layer and wherein the triplet energy of each of the co-host materials is greater than the triplet energy of the phosphorescent emitter;
  an exciton blocking layer adjacent the emitting layer on the anode side comprising a hole transporting material with triplet energy greater or equal to 2.5 eV; and
  a layer directly adjacent the light emitting layer on the cathode side comprising an electron transporting material with triplet energy greater than the phosphorescent emitter.

* * * * *

UNITED STATES PATENT AND TRADEMARK OFFICE
CERTIFICATE OF CORRECTION

PATENT NO. : 7,597,967 B2
APPLICATION NO. : 11/016108
DATED : October 6, 2009
INVENTOR(S) : Marina E. Kondakova et al.

It is certified that error appears in the above-identified patent and that said Letters Patent is hereby corrected as shown below:

| | |
|---|---|
| Column 50, line 64 | In Claim 1, delete "n in" and insert -- n is --, therefor. |
| Column 50, line 66 | In Claim 1, delete "n in" and insert -- n is --, therefor. |
| Column 52, line 1 | In Claim 3, delete "wherein;" and insert -- wherein: --, therefor. |
| Column 52, line 8 (Approx.) | In Claim 3, delete "n in" and insert -- n is --, therefor. |
| Column 52, line 10 (Approx.) | In Claim 3, delete "n in" and insert -- n is --, therefor. |
| Column 53, line 49 | In Claim 5, delete "n in" and insert -- n is --, therefor. |
| Column 53, line 51 | In Claim 5, delete "n in" and insert -- n is --, therefor. |
| Column 54, line 29 | In Claim 7, delete "b the" and insert -- by the --, therefor. |
| Column 54, line 49 | In Claim 7, delete "n in" and insert -- n is --, therefor. |
| Column 54, line 51 | In Claim 7, delete "n in" and insert -- n is --, therefor. |
| Column 54, line 64 | In Claim 7, delete "oxadiazole;" and insert -- triazole; --, therefor. |
| Column 55, line 40 | In Claim 9, delete "n in" and insert -- n is --, therefor. |
| Column 55, line 42 | In Claim 9, delete "n in" and insert -- n is --, therefor. |
| Column 55, line 55 | In Claim 9, delete "oxadiazole;" and insert -- triazine; --, therefor. |
| Column 56, line 14 | In Claim 11, after "comprising" insert -- : --. |
| Column 56, line 34 | In Claim 11, delete "napthyl" and insert -- naphthyl --, therefor. |
| Column 56, line 37 | In Claim 11, delete "n in" and insert -- n is --, therefor. |
| Column 56, line 39 | In Claim 11, delete "n in" and insert -- n is --, therefor. |

Signed and Sealed this

Nineteenth Day of January, 2010

David J. Kappos
*Director of the United States Patent and Trademark Office*